(12) United States Patent
Tiwari et al.

(10) Patent No.: US 9,898,253 B2
(45) Date of Patent: *Feb. 20, 2018

(54) DIVISION OPERATIONS ON VARIABLE LENGTH ELEMENTS IN MEMORY

(71) Applicant: Micron Technology, Inc., Boise, ID (US)

(72) Inventors: Sanjay Tiwari, Meridian, ID (US); Kyle B. Wheeler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

This patent is subject to a terminal disclaimer.

(21) Appl. No.: 15/063,986

(22) Filed: Mar. 8, 2016

(65) Prior Publication Data

US 2016/0266873 A1 Sep. 15, 2016

Related U.S. Application Data

(60) Provisional application No. 62/131,625, filed on Mar. 11, 2015.

(51) Int. Cl.
*G06F 7/535* (2006.01)
*G11C 7/10* (2006.01)
(Continued)

(52) U.S. Cl.
CPC ............... *G06F 7/535* (2013.01); *G11C 7/06* (2013.01); *G11C 7/10* (2013.01); *G11C 7/1006* (2013.01);
(Continued)

(58) Field of Classification Search
None
See application file for complete search history.

(56) References Cited

U.S. PATENT DOCUMENTS 3,927,311 A * 12/1975 Chen ..................... G06F 7/4915
708/624
4,380,046 A 4/1983 Fung
(Continued)

FOREIGN PATENT DOCUMENTS

| CN | 102141905 | 8/2011 |
| EP | 0214718 | 3/1987 |
| EP | 2026209 | 2/2009 |
| JP | H0831168 | 2/1996 |
| JP | 2009259193 | 3/2015 |

(Continued)

OTHER PUBLICATIONS

Dybdahl, et al., "Destructive-Read in Embedded DRAM, Impact on Power Consumption," Apr. 2006, (10 pgs.),vol. 2, Issue 2, Journal of Embedded Computing-Issues in embedded single-chip multicore architectures.

(Continued)

*Primary Examiner* — David H Malzahn
(74) *Attorney, Agent, or Firm* — Brooks, Cameron & Huebsch, PLLC

(57) ABSTRACT

Examples of the present disclosure provide apparatuses and methods for performing variable bit-length division operations in a memory. An example method comprises performing a variable length division operation on a first vector comprising variable length elements representing a number of dividends and stored in a group of memory cells coupled to a first access line and a number of sense lines of a memory array and a second vector comprising variable length elements representing a number of divisors stored in a group of memory cells coupled to a second access line and the number of sense lines of the memory array. The method can include dividing the first vector by the second vector by performing a number of operations. The method can include performing at least one of the number of operations without transferring data via an input/output (I/O) line.

38 Claims, 16 Drawing Sheets

(51) Int. Cl.
  *G11C 7/06* (2006.01)
  *G11C 11/4076* (2006.01)
  *G11C 11/4091* (2006.01)

(52) U.S. Cl.
  CPC ...... *G11C 11/4076* (2013.01); *G11C 11/4091* (2013.01); *G06F 2207/535* (2013.01)

(56) References Cited

U.S. PATENT DOCUMENTS

| | | |
|---|---|---|
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,173,305 B1 | 1/2001 | Poland |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |

(56) References Cited

U.S. PATENT DOCUMENTS

| | | |
|---|---|---|
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1* | 12/2010 | Noda ................ G11C 7/1006 326/10 |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Lerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0089166 A1 | 3/2015 | Kogge |
| 2015/0134713 A1* | 5/2015 | Wheeler ................ G06F 5/01 708/209 |
| 2015/0324290 A1 | 11/2015 | Leidel |
| 2015/0325272 A1 | 11/2015 | Murphy |
| 2016/0266873 A1* | 9/2016 | Tiwari ................ G11C 7/1006 |
| 2017/0269903 A1* | 9/2017 | Tiwari ................ G06F 7/535 |

FOREIGN PATENT DOCUMENTS

| | | |
|---|---|---|
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

(56) References Cited

OTHER PUBLICATIONS

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
DEBNATH, BIPLOB, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
U.S. Appl. No. 13/796,189, entitled, "Performing Complex Arithmetic Functions in a Memory Device," filed Mar. 12, 2013, (23 pgs).
Warren Jr., Henry S., "Hacker's Delight", Second Edition, Oct. 2013, pp. 181-184 and 194.
Morad et al., "GP-SIMD Processing-in-Memory", ACM Transactions on Architecture and Code Optimization, vol. 11, No. 4, Article 53, Jan. 2015.
Efnusheva et al., "A Novel Memory-centric Architecture and Organization of Processors and Computers", Proceedings of the 3rd International Conference on Applied Innovations in IT (ICAIIT), Mar. 2015.

* cited by examiner

| | COMP_COMP | SUBTRACTION MASK | ZERO DIVIDEND | DIVIDEND | DIVISOR | ELEM_MASK | QUOTIENT | REMAINDER |
|---|---|---|---|---|---|---|---|---|
| 451-0 | | | | 0x79865777 | 0x23322222 | 0x88888880 | 0xEEEEEEEE | 0xEEEEEEEE |
| 451-1 | | 0x00000000 | | 0x79865777 | 0x23322222 | 0x88888880 | 0xEEEEEEEE | 0xEEEEEEEE |
| 451-2 | | 0x00000000 | 0x00000000 | 0x79865777 | 0x23322222 | 0x88888880 | 0xEEEEEEEE | 0xEEEEEEEE |
| 451-3 | | 0x00000000 | 0x00000000 | 0x79865777 | 0x23322222 | 0x88888880 | 0x00000000 | 0xEEEEEEEE |
| 451-4 | 0x79865777 | 0x00000000 | 0x00000000 | 0x79865777 | 0x23322222 | 0x88888880 | 0x00000000 | 0x79865777 |
| 451-5.1.a | 0x79865777 | 0x00000000 | 0x79865777 | 0x79865777 | 0x23322222 | 0x88888880 | 0x00000000 | 0x79865777 |
| 451-5.1.b | 0x79865777 | 0xFFFFFFFF | 0x79865777 | 0x79865777 | 0x23322222 | 0x88888880 | 0x00000000 | 0x79865777 |
| 451-5.1.c | 0x79865777 | 0xFFFFFFFF | 0x79865777 | 0x79865777 | 0x23322222 | 0x88888880 | 0x00000000 | 0x56543555 |
| 451-5.1.d | 0x79865777 | 0xFFFFFFFF | 0x79865777 | 0x79865777 | 0x23322222 | 0x88888880 | 0x11111101 | 0x56543555 |
| 451-5.1.e | 0x2FD26222 | 0xFFFFFFFF | 0x79865777 | 0x79865777 | 0x23322222 | 0x88888880 | 0x11111101 | 0x56543555 |
| 451-5.2.a | 0x56543555 | 0xFFFFFFFF | 0x56543555 | 0x79865777 | 0x23322222 | 0x88888880 | 0x11111101 | 0x56543555 |
| 451-5.2.b | 0x56543555 | 0xFFFFFFFF | 0x56543555 | 0x79865777 | 0x23322222 | 0x88888880 | 0x11111101 | 0x33221333 |
| 451-5.2.c | 0x56543555 | 0xFFFFFFFF | 0x56543555 | 0x79865777 | 0x23322222 | 0x88888880 | 0x11111101 | 0x33221333 |
| 451-5.2.d | 0x56543555 | 0xFFFFFFFF | 0x56543555 | 0x79865777 | 0x23322222 | 0x88888880 | 0x22222202 | 0x33221333 |
| 451-5.2.e | 0x65762666 | 0xFFFFFFFF | 0x56543555 | 0x79865777 | 0x23322222 | 0x88888880 | 0x22222202 | 0x33221333 |
| 451-5.3.a | 0x33221333 | 0xFFFFFFFF | 0x33221333 | 0x79865777 | 0x23322222 | 0x88888880 | 0x22222202 | 0x33221333 |
| 451-5.3.b | 0x33221333 | 0xFF0F0FFF | 0x33221333 | 0x79865777 | 0x23322222 | 0x88888880 | 0x22222202 | 0x33221333 |
| 451-5.3.c | 0x33221333 | 0xFF0F0FFF | 0x33221333 | 0x79865777 | 0x23322222 | 0x88888880 | 0x22222202 | 0x10201111 |
| 451-5.3.d | 0x33221333 | 0xFF0F0FFF | 0x33221333 | 0x79865777 | 0x23322222 | 0x88888880 | 0x33232303 | 0x10201111 |
| 451-5.3.e | 0x23020222 | 0xFF0F0FFF | 0x33221333 | 0x79865777 | 0x23322222 | 0x88888880 | 0x33232303 | 0x10201111 |
| 451-5.4.a | 0x10201111 | 0xFF0F0FFF | 0x10201111 | 0x79865777 | 0x23322222 | 0x88888880 | 0x33232303 | 0x10201111 |
| 451-5.4.b | 0x10201111 | 0x00000000 | 0x10201111 | 0x79865777 | 0x23322222 | 0x88888880 | 0x33232303 | 0x10201111 |
| 451-5.4.c | 0x10201111 | 0x00000000 | 0x10201111 | 0x79865777 | 0x23322222 | 0x88888880 | 0x33232303 | 0x10201111 |
| 451-5.4.d | 0x10201111 | 0x00000000 | 0x10201111 | 0x79865777 | 0x23322222 | 0x88888880 | 0x33232303 | 0x10201111 |
| 451-5.4.e | 0x00000000 | 0x00000000 | 0x10201111 | 0x79865777 | 0x23322222 | 0x88888880 | 0x33232303 | 0x10201111 |

*Fig. 4A*

| | COMP_COMP 431 | SUBTRACTION MASK 433 | DIVISOR 439 | REMAINDER 445 | DYNAMIC_MASK 476 | STATIC_MASK 478 | DEST 492 | DEST+1 494 |
|---|---|---|---|---|---|---|---|---|
| 451-5.1.b.i | 0X88888880 | 0X00000000 | 0X23322222 | 0X79865777 | 0X88888880 | 0X7777777F | 0X00000000 | 0X00000000 |
| 451-5.1.b.ii | 0X44444440 | 0X00000000 | 0X23322222 | 0X79865777 | 0X44444440 | 0X7777777F | 0X58845555 | 0X00000000 |
| 451-5.1.b.iii | 0X00000000 | 0X00000000 | 0X23322222 | 0X79865777 | 0X00000000 | 0X7777777F | 0X7FF7777F | 0X00000000 |
| 451-5.1.b.iv | 0X7FF7777F | 0X00000000 | 0X23322222 | 0X79865777 | 0X88888880 | 0X7777777F | 0X7FF7777F | 0X00000000 |
| 451-5.1.b.v | 0X7FF7777F | 0X00000000 | 0X23322222 | 0X79865777 | 0X88888880 | 0X7777777F | 0X7FF7777F | 0X00000000 |
| 451-5.1.b.vi | 0X00000000 | 0X00000000 | 0X23322222 | 0X79865777 | 0X00000000 | 0X7777777F | 0X7FF7777F | 0X00000000 |
| 451-5.1.b.vii | 0XFFFFFFFF | 0XFFFFFFFF | 0X23322222 | 0X79865777 | 0X00000000 | 0X7777777F | 0XFFFFFFFF | 0X00000000 |

*Fig. 4B*

TABLE 8-1

| A | B | NOT OPEN | OPEN TRUE | OPEN INVERT |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

TABLE 8-2

| | | | | | | | | | | |
|---|---|---|---|---|---|---|---|---|---|---|
| | FF | 0 | 0 | 0 | 0 | 0 | 0 | 1 | 1 | 1 |
| | FT | 0 | 0 | 0 | 1 | 1 | 1 | 0 | 0 | 0 |
| | TF | 0 | 0 | 1 | 0 | 0 | 1 | 0 | 0 | 1 |
| | TT | 0 | 1 | 0 | 0 | 1 | 0 | 0 | 1 | 0 |
| A | B | A | A*B | A*B̄ | A+B | B | AXB | A+B̄ | A̅X̅B̅ | B̄ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

US 9,898,253 B2

DIVISION OPERATIONS ON VARIABLE LENGTH ELEMENTS IN MEMORY

PRIORITY INFORMATION

This application is a Non-Provisional of U.S. Provisional Application No. 62/131,625, filed Mar. 11, 2015, the contents of which are included herein by reference.

TECHNICAL FIELD

The present disclosure relates generally to semiconductor memory apparatuses and methods, and more particularly, to apparatuses and methods related to performing division operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAIVI), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIG. 4A illustrates a table showing the states of memory cells of an array at a particular phase associated with performing a division operation in accordance with a number of embodiments of the present disclosure.

FIG. 4B illustrates a table showing the states of memory cells of an array at a particular phase associated with performing a variable compare in accordance with a number of embodiments of the present disclosure.

DETAILED DESCRIPTION

Figure 1:
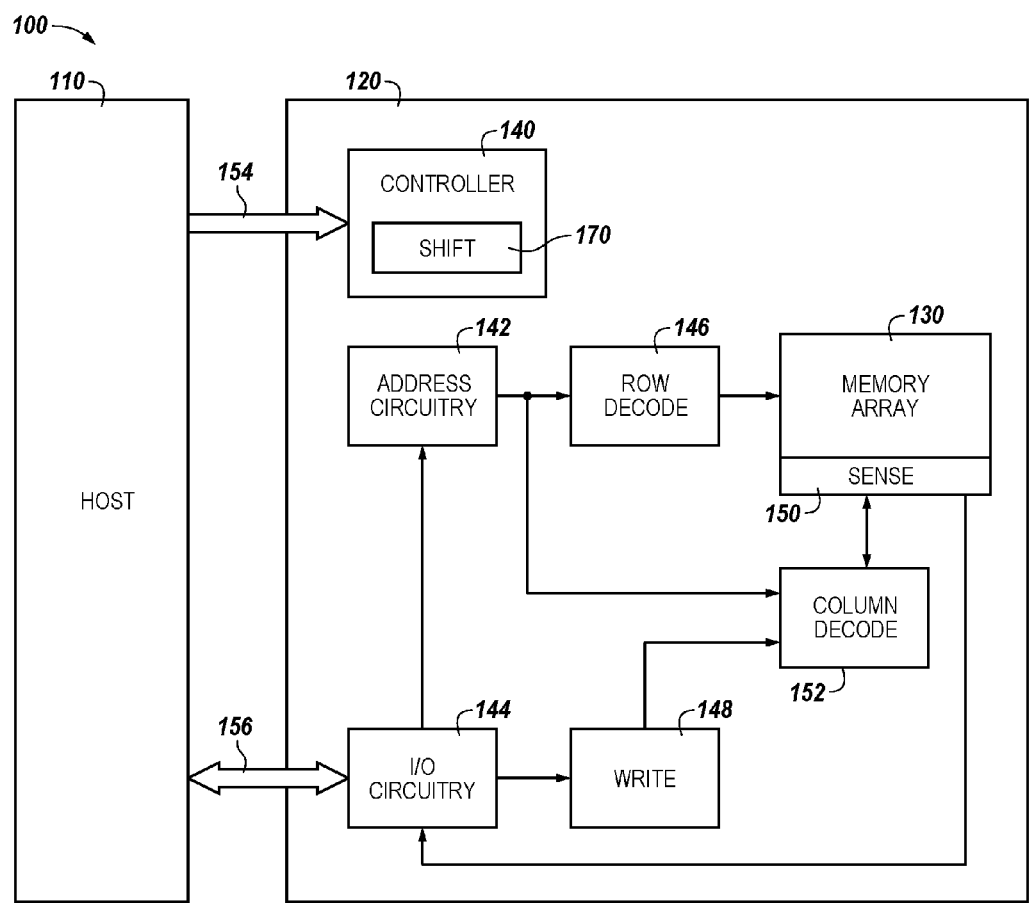
FIG. 1 is a block diagram of an apparatus in the form of a computing system including a memory device in accordance with a number of embodiments of the present disclosure.

The present disclosure includes apparatuses and methods related to division operations for memory. A division operation can be performed by dividing bit-vectors comprising variable bit-lengths. For example, a division operation can include dividing a first vector with variable length elements by a second vector with variable length elements. Variable length elements can refer to a number of elements in a same bit-vector with varying lengths. For example, a first element of a first bit-vector can be a particular length and a second element of the first bit-vector can be a length different than the particular length. The first vector can represent a number of dividends and be stored in a group of memory cells coupled to a first access line and a number of sense lines of a memory array. The second vector can represent a number of divisors and be stored in a group of memory cells coupled to a second access line and the number of sense lines of the memory array. The division operation can include a number of AND operations, OR operations, SHIFT operations, and INVERT operations performed without transferring data via an input/output (I/O) line.

As used herein, a first element and a second element can be numerical values that are divided by each other. Elements to be divided can be referred to as operands of a division operation. The elements can, in a number of embodiments, be numerical values that can be stored in memory as bit-vectors. For example, a first element (e.g., a first operand) having a first value and stored as a first bit-vector can be divided by a second element (e.g., a second operand) having a second value and stored as a second bit-vector to obtain a division result. A first bit-vector representing a number of dividends can include at least two elements of different bit-lengths whereby the first bit-vector is divided by a second bit-vector representing a number of divisors that includes at least two elements of the two corresponding different bit-lengths.

In a number of examples, an element can represent an object and/or other construct, which may be stored in memory as a bit-vector. As an example, a division operation can be performed to divide objects by dividing the bit-vectors that represent the respective objects.

A number of embodiments of the present disclosure can provide a reduction of the number of computations and/or time involved in performing a number of division operations (e.g., division functions) relative to previous approaches. For instance, the number of computations and/or the time can be reduced due to an ability to perform various portions of the number of division operations in parallel (e.g., simultaneously). Performing a number of division operations as described herein can also reduce power consumption as compared to previous approaches. In accordance with a number of embodiments, a division operation can be performed on elements (e.g., data in the form of bit-vectors stored in an array) without transferring data out of the memory array and/or sensing circuitry via a bus (e.g., data bus, address bus, control bus, etc.). A division operation can involve performing a number of operations (e.g., AND operations, OR operations, SHIFT operations, INVERT operations, and Block_OR operations, etc.). However, embodiments are not limited to these examples.

In various previous approaches, elements (e.g., a first value and a second value) to be divided may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single division function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU). For example, moving the data from the memory array to the processing resource can include performing a sense line address access (e.g., firing of a column decode signal) in order to transfer data from sense lines onto I/O lines, moving the data to the array periphery, and providing the data to a register in association with performing a division operation, for instance. Further, dividing elements of differing bit-length (e.g., an element of a first bit-length divided by an element of the first bit-length and an element of a second bit-length divided by an element of a second bit-length) in parallel can be difficult and consume power and time.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIGS. 2A and 2B. For instance, in a number of embodiments, the sensing circuitry 150 can comprise a number of sense amplifiers and a number of compute components, which may comprise latch serving as an accumulator and can be used to perform logical operations (e.g., on data associated with complementary sense lines). In a number of embodiments, the sensing circuitry (e.g., 150) can be used to perform division operations using data stored in array 130 as inputs and store the results of the division operations back to the array 130 without transferring via a sense line address access (e.g., without firing a column decode signal). As such, a division operation can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on control circuitry 140 or elsewhere)).

In various previous approaches, data associated with a division operation, for instance, would be read from memory via sensing circuitry and provided to an external ALU. The external ALU circuitry would perform the division operations using the elements (which may be referred to as operands or inputs) and the result could be transferred back to the array via the local I/O lines. In contrast, in a number of embodiments of the present disclosure, sensing circuitry (e.g., 150) is configured to perform a division operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the division operation as the sensing circuitry 150 can be operated to perform the appropriate computations involved in performing the division operation using the address space of memory array 130. Additionally, the division operation can be performed without the use of an external processing resource.

Figure 2A:
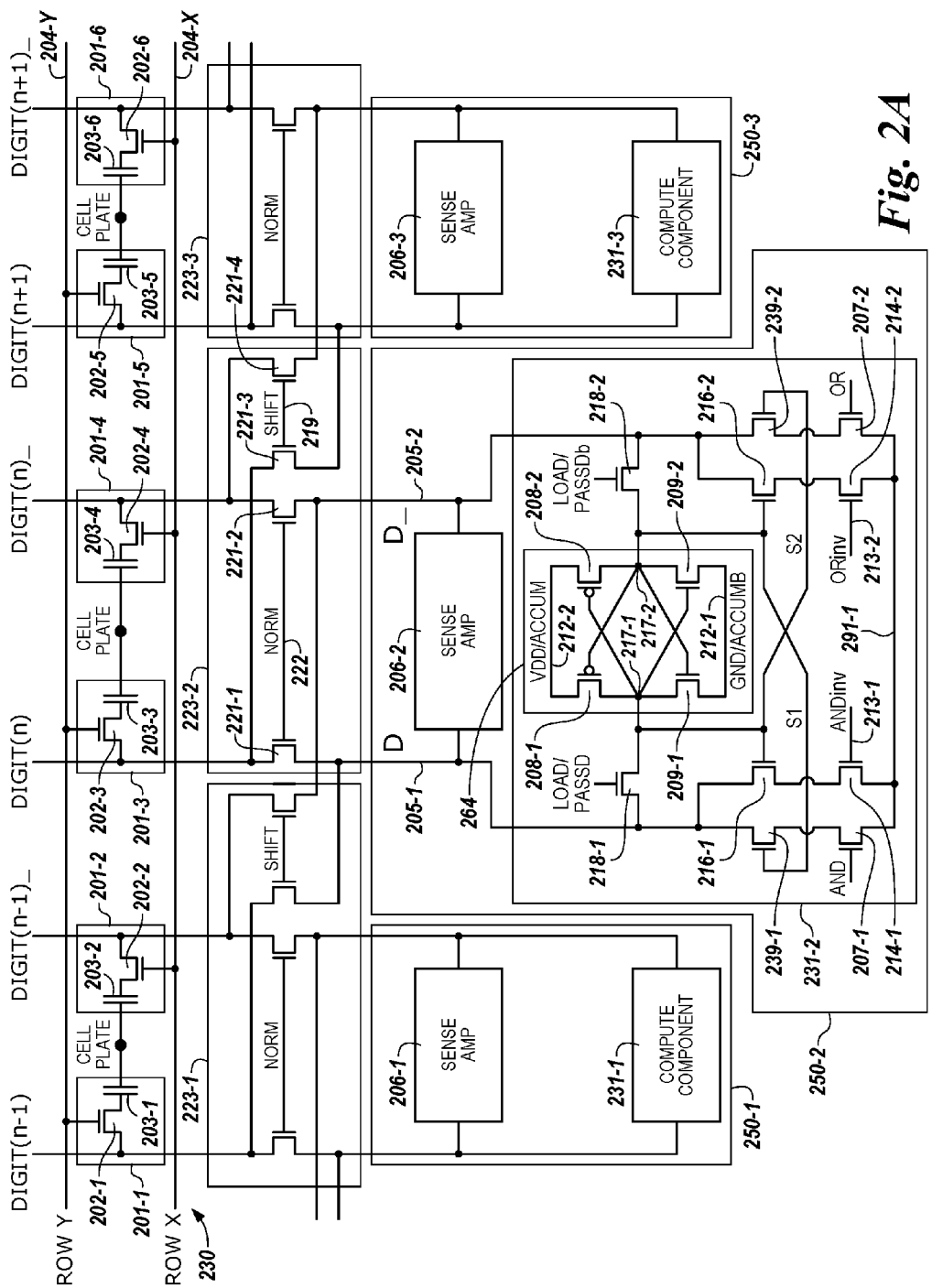
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell (e.g., one of memory cells 201-1, 201-2, 201-3, 201-4, 201-5, 201-6) comprises a storage element (e.g., one of corresponding capacitors 203-1 to 203-6) and an access device (e.g., one of corresponding transistors 202-1 to 202-6). For instance, memory cell 201-3 comprises transistor 202-3 and capacitor 203-3 memory cell 201-4 comprises transistor 202-4 and capacitor 203-4, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-4 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional number of (e.g., ten) transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch 264 of the compute component 231-2 can be collectively referred to herein as a secondary latch, which can serve as an accumulator. As such, the compute component 231-2 can operate as and/or be referred to herein as an accumulator. The compute component 231-2 can be coupled to each of the data lines D 205-1 and D_205-2 as shown in FIG. 2A. The transistors of compute component 231-2 can all be n-channel transistors (e.g., NMOS transistors), for example. However, embodiments are not limited to this example.

In this example, data line D 205-1 can be coupled to a first source/drain region of transistors 216-1 and 239-1, as well as to a first source/drain region of load/pass transistor 218-1. Data line D_205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND) 291-1). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating a LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 ($D_{13}$ ).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each have a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors. As used herein, configuration is intended to mean size, doping level, and transition type.

Load transistors can be configured (e.g., can be sized, doped, etc.) to handle loading specifications associated with coupling data lines to the local dynamic nodes S1 and S2, for example. Pass transistors, however, can be configured to handle heavier loading associated with coupling data lines to an adjacent accumulator (e.g., through the adjacent compute component 231-3 and shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. For example, load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch. For example, the gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2. As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
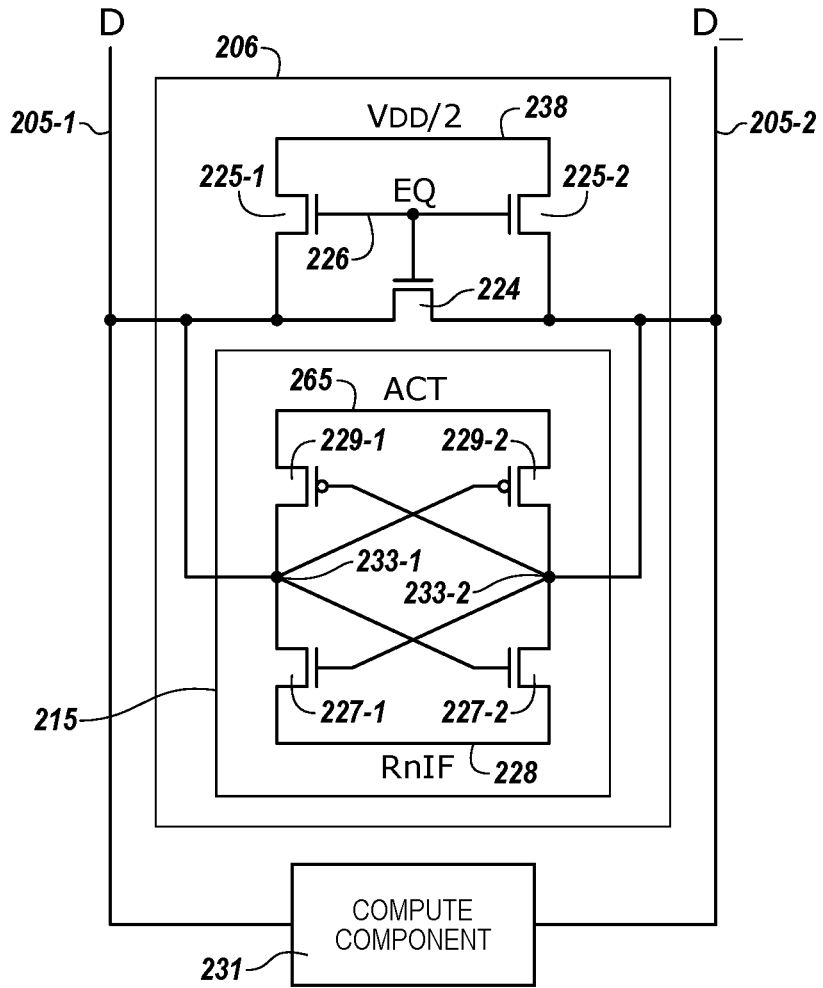
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In some examples, sensing circuitry 250-2 can include shifting can include shifting circuitry 223-2 and/or sensing circuitry 223-1. In this example, the shift circuitry 223-2 comprises a pair of isolation devices (e.g., isolation transistors 221-1 and 221-2) coupled to data lines 205-1 (D) and 205-2 (D_), respectively. The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be arranged as a portion of (e.g., within) the sense amplifier 206-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n)_ shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n)_ to the left and DIGIT(n+2) and DIGIT(n+2)_ to the right (not shown)).

Embodiments of the present disclosure are not limited to the configuration of shift circuitry 223-2 shown in FIG. 2A. For example, determining whether to shift in a particular direction to perform a shift operation is independent of the circuitry implementation. In a number of embodiments, shift circuitry 223-2 such as that shown in FIG. 2A can be operated (e.g., in conjunction with sense amplifiers 206-2 and compute components 231-2) in association with performing mathematical operations such as adding and subtracting operations without transferring data out of the sensing circuitry 250-2 via an I/O line (e.g., local I/O line (IO/IO_)), for instance.

Although not shown in FIG. 2A, each column of memory cells can be coupled to a column decode line that can be activated to transfer, via local I/O line (e.g., I/O line 334 in FIG. 3), a data value from a corresponding sense amplifier 206-2 and/or compute component 231-2 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform logical operations without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206-2) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). Sense amplifier 206-2 comprises a latch 215 including four transistors coupled to a pair of complementary data lines D 205-1 and D_205-2. The latch 215 can be a cross coupled latch. For example, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206-2 can also include circuitry configured to equilibrate the data lines D and D_(e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206-2 and compute component 231-2, and the result can be stored in the sense amplifier and/or compute component.

The sensing circuitry 250-2 (e.g., 250-2 in FIG. 2A) can be operated in several modes to perform logical operations, including a first mode in which a result of the logical operation is initially stored in the sense amplifier 206-2, and a second mode in which a result of the logical operation is initially stored in the compute component 231-2. Additionally with respect to the first operating mode, sensing circuitry 250-2 can be operated in both pre-sensing (e.g., sense amps fired before logical operation control signal active) and post-sensing (e.g., sense amps fired after logical operation control signal active) modes with a result of a logical operation being initially stored in the sense amplifier 206-2.

As described further below, the sense amplifier 206-2 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
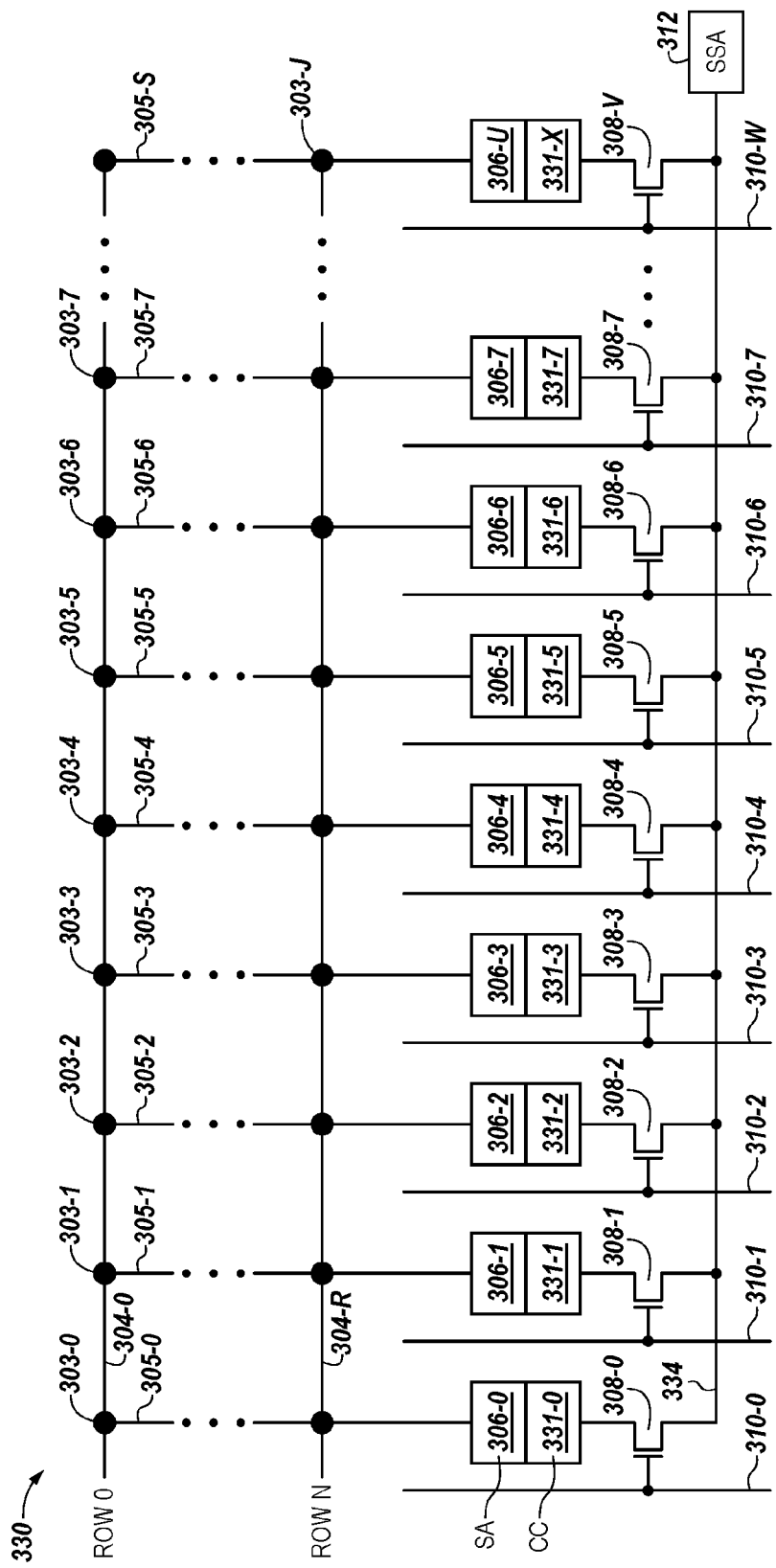
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells (referred to generally as memory cells 303, and more specifically as 303-0 to 303-J) coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X coupled to the respective sense lines. Column decode lines 310-1 to 310-W are coupled to the gates of transistors 308-1 to 308-V, respectively, and can be selectively activated to transfer data sensed by respective sense amps 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

In a number of embodiments, the sensing circuitry (e.g., compute components 331 and sense amplifiers 306) is configured to perform a division operation on elements stored in array 330. As an example, a first plurality of variable length elements (e.g., least significant element is an 8-bit element and the other six elements are 4-bit elements) can be stored in a first group of memory cells coupled to a particular access line (e.g., 304-0) and to a number of sense lines (e.g., 305-0 to 305-S), and a second plurality of variable length elements (e.g., least significant element is an 8-bit element and the other six elements are 4-bit elements) can be stored in a second group of memory cells coupled to a different access line (e.g., 304-1) and the respective number of sense lines (305-0 to 305-S). Each element of the first plurality of elements can be divided by a respective one of the second plurality of elements, and the result of the division operation can be stored (e.g., as a bit-vector(s)) in a third group of memory cells coupled to a particular access line (e.g., 304-0 to 304-R) and to the number of sense lines (e.g., 305-0 to 305-S). The third group of memory cells can, for example, be coupled to an access line 304-R or to at least one of access lines 304-0 to 304-R. For example, the third group of memory cells can be a same group of memory cells as the first group of memory cells or the second group of memory cells (e.g., a result of a division operation can be written over a currently stored element).

An example of a bitwise division operation is described below in association with FIG. 4A-4B, which illustrates tables showing the states of memory cells of an array (e.g., 330) at a number of particular phases associated with performing a division operation in accordance with a number of embodiments described herein. The reference numbers of the rows of the tables shown in FIG. 4A correspond to respective reference numbers of the pseudo code described below (e.g., row 451-1 corresponds to reference number 1 of the pseudo code, rows 451-5.1.a to 451-5.1.e correspond to reference number 5 (e.g., 5.a to 5.e) of the pseudo code, etc.). Each row of the tables indicates the values of a number of bit vectors 431 (Comp_Comp), 433 (Subtraction_Mask), 435 (Zero_Dividend), 437 (Dividend), 439 (Divisor), 441 (Elem_Mask), 443 (Quotient), and 445 (Remainder) at a particular phase of the division operation as can be stored in rows and/or columns of meory cells in the array (e.g., 330 in FIG. 3).

The example shown in FIG. 4A is associated with dividing a first seven elements stored in memory cells coupled to access line 304-0 and to sense lines 305-0 to 305-31 by a respective second seven elements stored in memory cells coupled to access line 304-1 and to sense lines 305-0 to 305-31. In the example below, the first seven elements are represented by bit-vector Dividend 437 (e.g., [0111 1001 1000 0110 0101 0111 01110111], which can be represented in hexadecimal notation as [0x7,9,8,6,5,7,77] (where the "0x" notation indicates hexadecimal and commas can separate different elements) and is shown in FIG. 4A as "0x79865777"). The second seven elements are represented by bit-vector Divisor 439 (e.g., [0010 0011 0011 0010 0010 0010 00100010], which can be represented in hexadecimal notation as [0x2,3,3,2,2,2,22] and is shown in FIG. 4A as "0x23322222"). The expected result of dividing the Dividend bit-vector 437 by the Divisor bit-vector 439 is Quotient bit-vector 443 [0x33232303] with a remainder indicated by Remainder bit-vector 445 of [0x10201111], which is shown in row 451-5.4.e of the table shown in FIG. 4A (e.g., at bit-vector columns 443 and 445).

In this example, the bit-vectors Dividend 437 and Divisor 439 have a length of 32 bits and the "ith" element of Dividend 437 is divided by the "ith" element of Divisor 439 (e.g., the first element of Dividend 437 is divided by the first element of Divisor 439, the second element of Dividend 437 is divided by the second element of Divisor 439, etc.), such that seven element pairs are divided. In this example, the seven elements represented by each of Divided 437 and Divisor 439 have a variable length. For instance, the first, second third, fourth, fifth, and sixth elements of Dividend 437 and Divisor 439 are represented by respective 4-bit vectors (e.g., the first, second, third, fourth, fifth, and sixth elements comprise 4 bits) and the seventh element of Dividend 437 and Divisor 439 are represented by an 8-bit vector (e.g., the seventh element comprises 8 bits). It is noted that although hexadecimal notation is used in FIG. 4A, the bit-vectors are stored as binary data patterns in the array during the division operation. Also, in the examples described herein, commas and/or spaces may be used to separate individual elements within a bit-vector. For instance, in the example above, the bit-vectors 437 and 439 each comprise seven elements which can be separated by spaces. Embodiments are not limited to a particular element size (e.g., to a particular number of elements and/or bits per element). The result of the division operation can be stored in array (e.g., 330) in which the vectors comprising the elements being divided are stored, and/or can be transferred external to the array (e.g., to functional unit circuitry of a host).

The expected result of dividing the element pairs of Dividend 437 (e.g., [0x79865777] in hexadecimal) and Divisor 439 (e.g., [0x23322222] in hexadecimal) is Quotient bit-vector [0x33232303] (e.g., 443) with Remainder bit-vector [0x10201111] (e.g., 445). As described further below, the result of a division operation can be stored as a bit-vector in a particular group of memory cells. For instance, in the example of FIG. 4A, the memory cells corresponding to Quotient 443 and Remainder 445 are used to store the result of the division operation. As such, at the conclusion of the example described in FIG. 4A, the value of Quotient 437 [0x33232303] in hexadecimal (e.g., binary [0011 0011 0010 0011 0010 0011 00000011]), which represents the seven resultant quotient values corresponding to the seven element pairs (e.g., quotients of 7/2=3, 9/3=3, 8/3=2, 6/2=3, 5/2=2, 7/2=3, and 119/34=03 (e.g., [0x77]/[0x22]=[0x03]) and the seven resultant remainder values corresponding to the seven element pairs (e.g., remainders 1, 0, 2, 0, 1, 1, and 17 (e.g., [0x11]).

As described further below, the bit vectors 433 (Subtraction_Mask), 435 (Zero_Dividend), 441 (Elem_Mask), 443 (Quotient), and 445 (Remainder) can be used in association with dividing respective element pairs of the source bit-vectors 437 and 439 (e.g., the elements of the Dividend bit-vector 437 are divided by the respective elements of the Divisor bit-vector 439). The bit-vectors 433, 435, 441, 443, and 445 can be stored in respective groups of memory cells coupled to particular access lines, which may be referred to as temporary storage rows. As used herein, temporary storage rows of memory cells are storing data that may be updated during various phases of a division operation. As an example, the bit-vectors 433, 435, 441, 443, and 445 can have a same length as the Dividend and Divisor bit-vectors 437 and 439, respectively, and can be stored in cells coupled to the same sense lines as the Dividend and Divisor bit-vectors (e.g., sense lines 305-0 to 305-31). For instance, the bit-vector 433 (Subtraction_Mask) can have a length of 32 bits and can be stored in a group of cells coupled to access line 304-2 (not shown) and to sense lines 305-0 to 305-31, the bit-vector 435 (Zero_Dividend) can have a length of 32 bits and can be stored in a group of cells coupled to access line 304-3 (not shown) and to sense lines 305-0 to 305-31, the bit-vector 441 (Elem_Mask) can have a length of 32 bits and can be stored in a group of cells coupled to access line 304-4 (not shown) and to sense lines 305-0 to 305-31, the bit-vector 443 (Quotient) can have a length of 32 bits and can be stored in a group of cells coupled to access line 304-5 (not shown) and to sense lines 305-0 to 305-31, and the bit-vector 445 (Remainder) can have a length of 32 bits and can be stored in a group of cells coupled to access line 304-6 and to sense lines 305-0 to 305-31. The bit-vector 431 (Comp_Comp) represents the data stored in the sensing circuitry (e.g., compute components 331 and/or sense amplifiers 306) corresponding to the sense lines having cells coupled thereto which store elements being divided (e.g., sense lines 305-0 to 305-31 in this example).

In the example described in association with FIG. 4A, the first element of the Dividend bit-vector 437 (e.g., hexadecimal value "7" in the most significant element position) can be stored (e.g., as a four bit bit-vector [0111]) in memory cells 303-0 to 303-3, and the first element of the Divisor bit-vector 439 (e.g., hexadecimal value "2" in the most significant element position) can be stored (e.g., as a four bit bit-vector [0010]) in memory cells coupled to access line 304-1 (e.g., ROW 1, not shown) and sense lines 305-0 to 305-3. As an example, the most significant bits (MSBs) of the respective bit-vectors (e.g., [0111] and [0010]) can be stored in cells coupled to sense line 305-0, the next MSBs of the respective bit-vectors can be stored in cells coupled to sense line 305-1, . . . , and the least significant bits (LSBs) of the respective bit-vectors can be stored in cells coupled to sense line 305-3. As used herein, the left most bit of a bit-vector is considered the MSB; however, embodiments are not so limited.

In a number of examples, a division operation includes performing a number of AND operations, OR operations, SHIFT operations, INVERT operations, and BlockOR operations. The division operation includes performing the AND operations, OR operations, SHIFT operations, and INVERT operations without transferring data via an input/output (I/O) line to divide a first element by a second element. The number of AND operations, OR operations, INVERT operations, and SHIFT operations can be performed using sensing circuitry on pitch with the memory array and with each of a number of columns of complementary sense lines.

The below pseudocode represents instructions executable to perform a number of division operations in a memory in accordance with a number of embodiments of the present disclosure. The example pseudocode is referenced using reference numbers 0-5, which correspond to the reference numbers of the rows shown in the tables of FIG. 4A and in reference to the column numbers of FIG. 4A. For instance, reference number 0 (e.g., "Get Temp Row Subtraction_Mask") corresponds to row 451-0, column 433, reference number 1 (e.g., "Get Temp Row Zero_Dividend") corresponds to row 451-1, column 435. Reference number 5.1..a (e.g., "Copy Remainder to Zero_Dividend and Comp_Comp") corresponds to rows 451-5.1.a, 451-5.2.a, 451-5.3.a and 451-5.4.a, and columns 445, 435, and 431 shown in FIG. 4A.

0. Get Temp Rows Dividend, Divisor, Elem_Mask, Quotient, and Remainder
   1. Get Temp Row Subtraction_Mask
   2. Get Temp Row Zero_Dividend
   3. Clear Row Quotient
   4. Copy Row Dividend to Remainder and Comp_Comp
   5. Run loop While(BlockOR)
      5.a Copy Row Remainder to Zero_Dividend and Comp_Comp
      5.b Variable Compare Row Remainder, Divisor, Elem_Mask, output to Subtraction_Mask
      5.c. Using Subtraction_Mask, subtract Divisor from Remainder and output to Remainder
      5.d. Using Subtraction_Mask, increment Quotient
      5.e XOR Remainder and Zero_Dividend, store in Comp_Comp For purposes of discussion, the above pseudo code will be divided into a setup phase and a division phase associated with performing a division operation (e.g., dividing the seven elements of the Dividend bit-vector 437 by the corresponding seven elements of the Divisor bit-vector 439). The pseudo code referenced by reference numbers 0-4 can correspond to the setup phase. The setup phase can be performed simultaneously for a number of the division operations. In the example illustrated in FIG. 4A, a bit-vector value illustrated in bold indicates a change in the value of the bit-vector (e.g., the value of the bit-vector stored in the memory cells corresponding to Subtraction_Mask 433 is shown in bold in FIG. 4 to indicate a change from [0x00000000] as shown in row 451-5.1.a to [0xFFFFFFFF] as shown in row 451-5.1.b). FIG. 4A illustrates the values of a number of bit-vectors associated with performing the setup phase of a division operation. The pseudo code referenced by reference number 5 (e.g., 5.a-5.e) can correspond to the division phase.

In a number of embodiments, the setup phase can be performed simultaneously for all of the elements that will be divided. The results (e.g., the resulting stored bit-vectors) corresponding to a number of operations performed in the setup phase are shown in FIG. 4A. Rows 451-0 to 451-4 of the table in FIG. 4A corresponds to the above pseudocode instructions referenced by reference numbers 0 to 4, respectively. As such, rows 451-0 to 451-4 indicate values of the bit vectors 431, 433, 435, 437, 441, 443, and 445 during execution of the setup phase as described by the above pseudocode. Reference number 0 (e.g., "Get Temp Rows Dividend, Divisor, Elem_Mask, Quotient, and Remainder") of the above pseudocode is associated with initializing a number of groups of memory cells for use as temporary storage rows to be used to store bit-vectors (e.g., 437, 439, 441, 443, and 445). Initializing refers to designating and/or assigning particular access lines used to store particular bit-vectors for performing the division operation. For example, the number of groups of memory cells can be initialized and/or designated groups of cells that can be coupled to respective access lines (e.g., rows) that store data (e.g., on a temporary basis) in association with performing the division operation. For example, a first group of memory cells can be coupled to a particular access line (e.g., 304-2, ROW 2, not shown) and can store a bit-vector referred to as a "Subtraction_Mask" bit-vector 433. A second group of memory cells can be coupled to another access line (e.g., 304-3, ROW 3 not shown) and can store a bit-vector referred to as a "Zero_Dividend" bit-vector 435. A third group of memory cells can be coupled to another access line (e.g., 304-4, ROW 4, not shown) and can store a bit-vector referred to as a "Elem_Mask" bit-vector 441. A fourth group of memory cells can be coupled to another access line (e.g., 304-5, ROW 5, not shown) and can store a bit-vector referred to as a "Quotient" bit-vector 443. A fifth group of memory cells can be coupled to another access line (e.g., 304-6, ROW 6, not shown) and can store a bit-vector referred to as a "Remainder" bit-vector 445. Embodiments are not limited to a particular number of temporary storage rows and/or to storage of the corresponding bit-vectors on particular access lines. Also, although the groups of memory cells used to store bit-vectors 433, 435, 441, 443, and 445 may be referred to as "rows," the respective groups of memory cells may comprise fewer than all of the cells coupled to a particular access line (e.g. ROW). Furthermore, in a number of embodiments, temporary storage rows can refer to access lines which may not be addressable by a user (e.g., access lines that are outside of a user-addressable address space). In a number of examples, the bit-vectors stored in memory cells corresponding to the temporary storage rows are stored in memory cells coupled to the same sense lines as the element pairs that are being divided. For example, the LSBs of the source bit-vectors 437 and 439 can be stored in memory cells coupled to a same sense line as the sense line to which the memory cells storing the LSBs of the bit-vectors 433, 435, 441, 443, and 445 are coupled. Likewise and similarly, the MSBs of the source bit-vectors 437 and 439 (e.g., variable length element dividends and variable length element divisors, respectively) can be stored in memory cells coupled to a same sense line as the sense line to which the memory cells storing the MSBs of the bit-vectors 433, 435, 441, 443, and 445 are coupled. For example, if each of the bit-vectors have a length of 32-bits, the LSBs of each of the bit-vectors 443, 445, 433, 435, 437, 439, 441, can be stored in memory cells coupled to a same sense line (e.g., 305-31). Likewise, the MSBs of each of the bit-vectors 443, 445, 433, 435, 437, 439, and 441 can be stored in memory cells coupled to a same sense line (e.g., 305-0).

The Elem_Mask 441 indicates a most significant bit (MSB) for each of the elements being divided. As an example, a bit pattern comprising a "1" in a MSB position and all "0s" in the remaining bit positions can be used to indicate the MSBs of the constituent elements of the source bit-vectors (e.g., Dividend 437 and Divisor 439). As such, the bit pattern of Elem_Mask 441 identifies the length of the respective element pairs to be divided. As shown in row 451-0 of FIG. 4A, in this example, Elem_Mask 419 is a 32-bit hexadecimal bit-vector [0x88888880] (e.g., binary [1000 1000 1000 1000 1000 1000 10000000]), which indicates that the first two six elements of 437 and 439 have a length of four bits and the seventh element of 437 and 439 have a length of eight bits.

Row 451-0 of the table shown in FIG. 4A illustrates the values of the Dividend and Divisor bit-vectors 437 and 439 upon being stored (e.g., loaded) in an array (e.g., 330). As noted above, although the values of the bit-vectors are shown in FIG. 4A in hexadecimal form for convenience, designated by the leading "0x" (e.g., the value of bit-vector 437 is shown as [0x79865777]), the bit-vectors can be stored as binary data patterns in the array. As noted above, an example division operation associated with execution of the above pseudocode includes dividing the first element (e.g., binary [0111]/hexadecimal [0x7]) of the Dividend bit-vector 437 by the first element (e.g., binary [0010]/hexadecimal [0x2]) of the Divisor bit-vector 339, the second element (e.g., binary [1001]/hexadecimal [0x9]) of the Dividend bit-vector 437 by the second element (e.g., binary [0011]/ hexadecimal [0x3]) of the Divisor bit-vector 439, the third element (e.g., binary/hexadecimal [0x8]) of the Divisor bit-vector 439 by the third element (e.g., binary [0011]/ hexadecimal [0x3] of the Divisor bit-vector 395, the fourth element (e.g., binary [0110]/hexadecimal [0x6]) of the Dividend bit-vector 437 by the fourth element (e.g., binary [0010]/hexadecimal [0x2]) of the Divisor bit-vector 439, the fifth element (e.g., binary [0101]/hexadecimal [0x5]) of the Dividend bit-vector 437 by the fifth element (e.g., binary [0010]/hexadecimal [0x2]) of the Divisor bit-vector 439, the sixth element (e.g., binary [0101]/hexadecimal [0x7]) of the Dividend bit-vector 437 by the sixth element (e.g., binary [0010]) of the Divisor bit-vector 439, and the seventh element (e.g., binary [01110111]/hexadecimal [0x77]) of the Dividend bit-vector 437 by the seventh element (e.g., binary [00100010]/hexadecimal [0x22]) of the Divisor bit-vector 439. For example, the $i^{th}$ element of the Dividend bit-vector 437 is divided by the $i^{th}$ element of the Divisor bit-vector 439.

Reference number 1 (e.g., "Get Temp Row Subtraction_Mask") of the above pseudocode is associated with initializing a number of groups of memory cells for use as a temporary storage row to store Subtraction_Mask bit-vector 433. The Subtraction_Mask bit-vector 433 can indicate a result of a variable compare operation. As used herein, a variable compare operation is intended to mean a comparison to determine which bit-vector element is greater than or equal to another bit-vector element (described further below). Reference number 2 (e.g., "Get Temp Row Zero_Dividend") of the above pseudocode is associated with initializing a number of groups of memory cells for use as a temporary storage row to store a Zero_Dividend bit-vector 435. Reference number 3 (e.g., "Clear Row Quotient") of the above pseudocode is associated with clearing a Quotient bit-vector 443. For example, a Quotient bit-vector 443 that stores a bit-vector [0xEEEEEEEE] when initialized is cleared to store bit-vector [0x00000000], as shown at row 451-3 in FIG. 4A.

Reference number 4 (e.g., "Copy Row Dividend to Remainder and Comp_Comp") of the above pseudocode is associated with storing a bit-vector stored as the Dividend bit-vector 437 (e.g., [0x79865777]) as a Remainder bit-vector 445 and to the Comp_Comp 431 (e.g., compute components 331-0 to 331-31 in FIG. 3), as illustrated at row 451-4 in FIG. 4A.

At the conclusion of the setup phase corresponding to reference numbers 0-4 of the above pseudocode, and as shown in row 451-4 of FIG. 4A, Subtraction_Mask 433 stores [0x00000000] (e.g., binary [0000 0000 0000 0000 0000 0000 00000000], Zero_Dividend 435 stores [0x00000000], Elem_Mask 441 stores [0x88888880], Quotient 443 stores [0x00000000], Remainder 445 stores [0x79865777]. Dividend 437 stores [0x79865777], which represents a first element comprising a decimal value of "7", a second element comprising a decimal value of "9", a third element comprising a decimal value of "8", a fourth element comprising a decimal value of "6," a fifth element comprising a decimal value of "5," a sixth element comprising a decimal value of "7," and a seventh element comprising a decimal value of "119." Divisor 439 stores [0x23322222], which represents a first element comprising a decimal value of "2," a second element comprising a decimal value of "3," a third element comprising a decimal value of "3," a fourth element comprising a decimal value of "2," a fifth element comprising a decimal value of "2," a sixth element comprising a decimal value of "2," and a seventh element comprising a decimal value of "34."

As used herein, performing a logical operation on a first and second bit-vector can include performing, in parallel, the logical operation on each of the respective bits at corresponding bit positions of the bit-vectors. As an example, the result of a logical OR operation performed on a first bit-vector "a" (e.g., [$a_0$ $a_1$ $a_2$ $a_3$]) and a second bit-vector "b" (e.g., [$b_0$ $b_1$ $b_2$ $b_3$]) is a bit-vector "c" (e.g., [$c_0$ $c_1$ $c_2$ $c_3$]) whose MSB (e.g., $c_0$) is the result of "ORing" the MSB of bit-vector "a" and the MSB of bit-vector "b," whose next MSB is the result of ORing the next MSBs of bit-vectors "a" and "b," and whose LSB is the result of ORing the LSB of bit-vector "a" and the LSB of bit-vector "b" (e.g., $c_0=a_0$ OR $b_0$; $c_1=a_1$ OR $b_1$; $c_2=a_2$ OR $b_2$; $c_3=a_3$ OR $b_3$). For instance, performing an OR operation on a bit-vector [1110] and on bit-vector [1000] would result in bit-vector [1110] (e.g., the MSB of the resultant bit-vector is "1" since "1" OR "1" is "1", the next MSB is "1" since "1" OR "0" is "1", the next MSB is "1" since "1" OR "0" is "1", and the LSB is "0" since "0" OR "0" is "0").

Reference number 5 of the above pseudocode (e.g., "Run Loop While(BlockOR)") corresponds to the division phase of a division operation in accordance with a number of embodiments of the present disclosure. Reference number 5 corresponds to a loop (e.g., a "For loop," a "While loop," a "Do loop," etc.) that comprises execution of the pseudocode corresponding to reference numbers 5.a-5.e until a particular condition is met. In this example, the particular condition is a BlockOR operation terminating (e.g., by returning a "0," or false bit, which indicates that the current bit pattern of Comp_Comp 431 comprises all "0s," e.g., that none of the compute components and/or sense amplifiers corresponding to Comp_Comp 431 store a "1," or true bit). As such, the division phase can comprise performing a number of iterations of the pseudocode corresponding to references 5.a-5.e, with a BlockOR operation being performed at the conclusion of each iteration. A BlockOR operation will be described further below.

The number of times the loop is performed can be based on the length of the element pairs being divided. For example, the number of times the loop is performed can be equal to the length of the longest of the element pairs. In this example in which the longest element pair comprises eight bits (e.g., the seventh element pairs comprise eight bits), the loop can be performed eight times (e.g., the BlockOR operation corresponding to reference number 5 terminates after the eighth iteration of the loop). However, embodiments are not limited to this example. For instance, the loop can be terminated after fewer iterations depending on the particular bit patterns of the elements being divided (e.g., if the bit patterns being divided have a number of leading "0s," then those bit positions will not change the result of the product). As such, each iteration of the primary loop can be executed in association with determining a contribution to the division operation of a quotient and a remainder associated with dividing a number of dividends by a number of divisors.

In a number of embodiments, a "BlockOR" operation can be performed in association with determining whether one or more (e.g., any) of the compute components (e.g., 331-0 to 331-X) and/or sense amplifiers (e.g., 306-0 to 306-U) coupled to a particular group of sense lines (e.g., 305-0 to 305-S) store a particular data value (e.g., a "1" or a "0"). For example, determining whether any of the compute components 331-0 to 331-31 coupled to sense lines 305-0 to 305-31 store a particular data value can include charging (e.g., precharging) a local I/O line such as local I/O line 334 shown in FIG. 3) to a particular voltage, and then sensing (e.g., via a secondary sense amplifier, such as SSA 312 shown in FIG. 3) whether the voltage on the local I/O line changes (e.g., by more than a threshold amount) responsive to transferring (e.g., in parallel) the voltages corresponding to the data latched in the selected compute components 331-0 to 331-31 to the local I/O line. The I/O line (e.g., I/O line 334) can be precharged via control circuitry such as control circuitry 140 shown in FIG. 1 and/or sensing circuitry such as circuitry 150 shown in FIG. 1, for instance, to a voltage such as a supply voltage (e.g., Vcc) or a ground voltage (e.g., 0V).

Transferring the voltages corresponding to the data latched in the selected compute components 331-0 to 331-31 can include activating (e.g., in parallel) the column decode lines (e.g., column decode lines 310-0 to 310-W in FIG. 3) corresponding to the selected sensing circuitry (e.g., compute components 331-0 to 331-31 in this example) such that respective transistors 308-0 to 308-31 are enabled (e.g., turned on)

As an example, to determine whether one or more of the selected compute components 331-0 to 331-31 stores (e.g., latches) a data value of "1" (e.g., a logic 1 which can be represented by a supply voltage Vcc), the local I/O line (e.g., I/O line 334) can be precharged to a ground voltage (e.g., 0V, which can represent a latched data value of "0"). The corresponding column decode lines 310-0 to 310-31 can be activated, and if one or more of the selected compute components 331-0 to 331-31 stores a logic 1 (e.g., Vcc), then the SSA (e.g., SSA 312) can sense a pull up (e.g., increase) of the voltage on the I/O line (e.g., I/O line 334) which indicates that at least one of the selected compute components 331-0 to 331-31 stores a "1," which can be indicated by the BlockOR operation returning a "true" bit (e.g., "1"). In this example, if none of the compute components 331-0 to 331-31 stored a "1," then the voltage on the I/O line would not be pulled up, which can be indicated by the BlockOR operation returning a false bit (e.g., "0").

Alternatively, to determine whether one or more of the selected compute components 331-0 to 331-31 stores (e.g., latches) a data value of "0," the I/O line (e.g., I/O line 334) can be pre-charged to a supply voltage (e.g., Vcc). The corresponding column decode lines 310-0 to 310-31 can be activated, and if one or more of the selected compute components 331-0 to 331-31 stores a logic 0 (e.g., 0V), then the SSA (e.g., SSA 312) can sense a pull down (e.g., decrease) of the voltage on the I/O line (e.g., I/O line 334) which indicates that at least one of the selected compute components 331-0 to 331-31 stores a "0."

The determination of whether one or more compute components (e.g., 331-0 to 331-X) and/or sense amplifiers (e.g., 306-0 to 306-U) coupled to selected column decode lines (e.g., column decode lines 310-0 to 310-W) stores a particular data value (e.g., a data value of "1") is effectively performing a logic "OR" operation (e.g., since the operation returns a "1" if any of the data values are "1" and the operation returns a "0" only if all of the data values are "0"), which is why the operation may be referred to as a "BlockOR" operation. Embodiments of the present disclosure are not limited to particular pre-charge voltages of the local I/O line and/or to particular voltage values corresponding to logic "1" and logic "0".

FIG. 4A illustrates a table showing the states of memory cells of an array at a particular iteration associated with performing a division operation in accordance with a number of embodiments of the present disclosure. FIG. 4A illustrates the values of the number of bit-vectors 431, 433, 435, 437, 439, 441, 443, and 445 during a first iteration 451-5.1 of the loop, a second iteration 451-5.2 of the loop, a third iteration 451-5.3 of the loop, and a fourth iteration 451-5.4 of the loop associated with reference numbers 5.a-5.e referenced above.

During a first iteration (e.g., illustrated as 451-5.1 in FIG. 4A), reference 5.a. (e.g., "Copy Row Remainder to Zero_Dividend and Comp_Comp") of the above pseudocode is associated with loading Remainder 445 (e.g., [0x79865777]) into Zero_Dividend 435 and Comp_Comp 431, as illustrated at row 451-5.1.a. For example, Zero-Dividend 435 and Comp_Comp 431 now store [0x79865777].

Reference 5.b (e.g., "Variable Compare Row Remainder, Divisor, Elem_Mask, output to Subtraction_Mask") of the above pseudocode is associated with performing a variable compare operation on Remainder 445 and Divisor 439, using Elem_Mask 441 as a mask to perform the variable compare operation. The variable compare operation compares a first number of variable length elements to a second number of variable length elements. The variable compare operation determines whether each of the first variable length elements is greater than, equal to, or less than the second variable length elements. For example, in the first iteration 451-5.1, at reference 5.b, a number of variable length elements of Remainder 445 (e.g., [0x79865777]) is compared to a number of variable length elements of Divisor 439 (e.g., [0x23322222]). For example, a seventh element (e.g., most significant element [0x7]) of Remainder 445 is compared to a seventh element (e.g., most significant element [0x2]) of Divisor 439. A result of performing a variable compare on the corresponding seventh elements would output [0xF]. The variable compare output of [0xF], since the first element was compared to the second (and not vice versa), would indicate that [0x7] is greater than [0x2]. A sixth element (e.g., [0x9]) of Remainder 445 is compared to a sixth element (e.g., [0x3]) of Divisor 439 and the variable compare determines that [0x9] is greater than [0x3]. Further, a fifth (e.g., [0x8]), fourth (e.g., [0x6]), third (e.g., [0x5]), second (e.g., [0x7]), and first element (e.g., [0x77]) of Remainder 445 are compared to a respective fifth (e.g., [0x3]), fourth (e.g., [0x2]), third (e.g., [0x2]), second (e.g., [0x2]), and first element (e.g., [0x22]) of Divisor 439. Performing the variable compare on the seven elements would result in a bit-vector of [0xFFFFFFFF], as illustrated by Subtraction_Mask 433 at 451-5.1.b, which indicates that each of the seven elements of Remainder 445 (e.g., [0x79865777]) is greater than each of the seven elements of Divisor 439 (e.g., [0x23322222]). A more detailed explanation of how the variable compare operation is performed can be found in the discussion of FIG. 4B below.

At reference 5.c (e.g., Using Subtraction_Mask, subtract Divisor from Remainder and output to Remainder), a subtraction operation is performed to subtract a number of elements of Divisor 439 (e.g., [0x23322222]) from a number of elements of Remainder 445 (e.g., [0x79865777]) based on Subtraction_Mask 433 (e.g., [0xFFFFFFFF]). For example, since the Subtraction_Mask 433 is [0xFFFFFFFF]), each element of Divisor 439 is subtracted from each element of Remainder 445. When the Subtraction_Mask 433 includes a [0] in an element, that element is not subtracted. For example, if Subtraction_Mask 433 included [0xFF00FFFF], then the fourth and fifth element (containing "0"s) would not be subtracted. In this example, the value of the first element (e.g., least significant element) of Divisor 439 (e.g., [0x22]) is subtracted from the value of the first element of Remainder 445 (e.g., [0x77], resulting in [0x55]. A second element of Divisor 439 (e.g., [0x2]) is subtracted from a second element of Remainder 445 (e.g., [0x7], resulting in [0x5]. A third element of Divisor 439 (e.g., [0x2]) is subtracted from a third element of Remainder 445 (e.g., [0x5]), resulting in [0x3]; a fourth element of Divisor 439 (e.g., [0x2]) is subtracted from a fourth element of Remainder 445 (e.g., [0x6]), resulting in [0x4]; a fifth element of Divisor 439 (e.g., [0x3]) is subtracted from a fifth element of Remainder 445 (e.g., [0x8]), resulting in [0x5]; a sixth element of Divisor 439 (e.g., [0x3]) is subtracted from a sixth element of Remainder 445 (e.g., [0x9]), resulting in [0x6]; and a seventh element of Divisor 439 (e.g., [0x2]) is subtracted from a seventh element of Remainder 445 (e.g., [0x7]), resulting in [0x5]. Therefore, the resulting bit-vector from subtracting Divisor 439 (e.g., [0x23322222]) from Remainder 445 (e.g., [0x79865777]) is bit-vector [0x56543555], as illustrated as Remainder 445 at 451-5.1.c in FIG. 4A.

At reference 5.d (e.g., Using Subtraction_Mask, increment Quotient), a Quotient bit-vector 443 (e.g., [0x00000000]) is incremented one position to the left. For example, a "1" enters the first index (e.g., least significant bit position) of each element of Quotient 443 (e.g., [0x11111101]), as illustrated at 451-5.1.d. The Subtraction_Mask 433 is used, as described above, by incrementing the elements including a [0xF] element (for a 4-bit element) and not incrementing a [0x0] element.

At reference 5.e. (e.g., "XOR Remainder and Zero_Dividend, store in Comp_Comp"), an XOR operation is performed on Remainder 445 (e.g., [0x56543555]) and Zero_Dividend 435 (e.g., [0x79865777]). An XOR operation on two bit-vectors can include performing a number of NAND, OR, and AND operations. The XOR operation on the two bit-vectors can include performing an AND operation on a result of a NAND operation and a result of an OR operation (e.g., A XOR B=(A OR B) AND (A NAND B)). For example, an XOR operation can be performed on a first bit-vector (e.g., [0011]) and a second bit-vector (e.g., [0110]). The XOR operation includes a NAND operation that can be performed on the first and second bit-vector, resulting in a bit-vector [1101] (e.g., ANDing [0011] and [0110] to result in [0010], and inverting the [0010] bit-vector to result in an XOR result of [1101]). The XOR operation includes an OR operation that can be performed on the first and second bit-vector, resulting in bit-vector [0111] (e.g., ORing [0011] and [0110]). The XOR operation includes an AND operation that can be performed on the result of the NAND operation (e.g., NAND operation result [1101]) and the result of the OR operation (e.g., OR operation result [0111]). The result of the AND operation (e.g., ANDing [1101] and [0111]) is bit-vector [0101], which is the result of an XOR operation performed on the first bit-vector (e.g., [0011]) and the second bit-vector (e.g., [0110]).

Performing an XOR operation on Remainder 445 (e.g., [0x56543555]) and Zero_Dividend 435 (e.g., [0x79865777]) results in bit-vector [0x2FD26222], as illustrated as stored in Comp_Comp 431 at 451-5.1.*e* in FIG. 4A. At the end of first iteration 451-5.1, a BlockOR operation is performed on the bit-vector stored in Comp_Comp 431 (e.g., bit-vector [0x2FD26222]). Since [0x2FD26222] includes at least one "1" bit-value, an additional iteration is performed (e.g., second iteration 451-5.2).

During a second iteration 451-5.2, reference 5.*a*. (e.g., "Copy Row Remainder to Zero_Dividend and Comp_Comp") of the above pseudocode is associated with loading Remainder 445 (e.g., [0x56543555]) into Zero_Dividend 435 and Comp_Comp 431, as illustrated at row 451-5.2.*a*. For example, Zero-Dividend 435 and Comp_Comp 431 now store [0x56543555].

At reference 5.*b* (e.g., "Variable Compare Row Remainder, Divisor, Elem_Mask, output to Subtraction_Mask") of the second iteration 451-5.2, the above pseudocode is associated with performing a variable compare operation on Remainder 445 and Divisor 439, using Elem_Mask 441 as a mask to perform the variable compare operation. For example, a number of variable length elements of Remainder 445 (e.g., [0x56543555]) is compared to a number of variable length elements of Divisor 439 (e.g., [0x23322222]). Performing the variable compare on Remainder 445 and Divisor 439 results in bit-vector [0xFFFFFFFF], as illustrated by Subtraction_Mask 433 at 451-5.2.*b*, which indicates that each of the seven elements of Remainder 445 (e.g., [0x56543555]) is greater than each of the seven elements of Divisor 439 (e.g., [0x23322222]).

At reference 5.*c* (e.g., Using Subtraction_Mask, subtract Divisor from Remainder and output to Remainder), a subtraction operation is performed to subtract a number of elements of Divisor 439 (e.g., [0x23322222]) from a number of elements of Remainder 445 (e.g., [0x56543555]) based on Subtraction_Mask 433 (e.g., [0xFFFFFFFF]). For example, since the Subtraction_Mask 433 is [0xFFFFFFFF]), each element of Divisor 439 is subtracted from each element of Remainder 445. Performing a subtraction operation to subtract Divisor 439 from Remainder 445 results in bit-vector [0x33221333], as illustrated by Remainder 445 at 451-5.2.*c* in FIG. 4A.

At reference 5.*d* (e.g., Using Subtraction_Mask, increment Quotient), a Quotient bit-vector 443 (e.g., [0x11111101]) is incremented one position to the left. For example, a "1" in each of the least significant bit positions of each element of Quotient 443 is shifted to the left one position, resulting in Quotient 443 [0x22222202], as illustrated at 451-5.2.*d*. Since the Subtraction_Mask 433 is [0xFFFFFFFF] (e.g., no "0" in the Subtraction_Mask 433), each element of Quotient 443 is incremented.

At reference 5.*e*. (e.g., "XOR Remainder and Zero_Dividend, store in Comp_Comp"), an XOR operation is performed on Remainder 445 (e.g., [0x33221333]) and Zero_Dividend 435 (e.g., [0x56543555]). An XOR operation on two bit-vectors can include performing a number of NAND, OR, and AND operations. The XOR operation on the two bit-vectors can include performing an AND operation on a result of a NAND operation and a result of an OR operation (e.g., A XOR B=(A OR B) AND (A NAND B)). Performing an XOR operation on Remainder 445 (e.g., [0x33221333]) and Zero_Dividend 435 (e.g., [0x56543555]) results in bit-vector [0x65762666], as illustrated as stored in Comp_Comp 431 at 451-5.2.*e* in FIG. 4A. At the end of second iteration 451-5.2, a BlockOR operation is performed on the bit-vector stored in Comp_Comp 431 (e.g., bit-vector [0x65762666]). Since [0x65762666] includes at least one "1" bit-value, an additional iteration is performed (e.g., third iteration 451-5.3).

During a third iteration, reference 5.*a*. (e.g., "Copy Row Remainder to Zero_Dividend and Comp_Comp") of the above pseudocode is associated with loading Remainder 445 (e.g., [0x33221333]) into Zero_Dividend 435 and Comp_Comp 431, as illustrated at row 451-5.3.*a*. For example, Zero-Dividend 435 and Comp_Comp 431 now store [0x33221333].

At reference 5.*b* (e.g., "Variable Compare Row Remainder, Divisor, Elem_Mask, output to Subtraction_Mask") of the third iteration 451-5.3, the above pseudocode is associated with performing a variable compare operation on Remainder 445 and Divisor 439, using Elem_Mask 441 as a mask to perform the variable compare operation. For example, a number of variable length elements of Remainder 445 (e.g., [0x33221333]) is compared to a number of variable length elements of Divisor 439 (e.g., [0x23322222]). Performing the variable compare on Remainder 445 and Divisor 439 results in bit-vector [0xFF0F0FFF], as illustrated by Subtraction_Mask 433 at 451-5.3.*b*, which indicates that the first element (e.g., least significant element bolded in bit-vector [0xFF0F0FFF]), second element (e.g., [0xFF0F0FFF]), fourth element (e.g., [0xFF0F0FFF]), sixth element (e.g., [0xFF0F0FFF]), and seventh element (e.g., [0xFF0F0FFF]) of Remainder 445 (e.g., [0x33221333]) are each greater than or equal to the corresponding elements of Divisor 439 (e.g., [0x23322222]).

At reference 5.*c* (e.g., Using Subtraction_Mask, subtract Divisor from Remainder and output to Remainder), a subtraction operation is performed to subtract a number of elements of Divisor 439 (e.g., [0x23322222]) from a number of elements of Remainder 445 (e.g., [0x33221333]) based on Subtraction_Mask 433 (e.g., [0xFF0F0FFF]). For example, since the Subtraction_Mask 433 is [0xFF0F0FFF]), the first (least significant), second, fourth, sixth, and seventh elements (each element including "F") of Remainder 445 are subtracted from corresponding elements of Divisor 439 while the third and fifth elements (each element including "0") are not subtracted. Performing a subtraction operation to subtract Divisor 439 from Remainder 445 results in bit-vector [0x10201111], as illustrated by Remainder 445 at 451-5.3.*c* in FIG. 4A.

At reference 5.*d* (e.g., Using Subtraction_Mask, increment Quotient), a Quotient bit-vector 443 (e.g., [0x22222202]) is incremented one position to the left based on the Subtraction_Mask 433 (e.g., [0xFF0F0FFF]). For example, a "2" (e.g., "0010") in each of the first, second, fourth, sixth, and seventh elements of Quotient 443 (corresponding to the "F"s of Subtraction_Mask 433 [0xFF0F0FFF]) is shifted to the left one position, resulting in Quotient 443 [0x33232303], as illustrated at 451-5.3.*d*. The third and fifth elements of Quotient 443 are not incremented since the third and fifth elements correspond to elements of Subtraction_Mask 433 including "0"s.

At reference 5.*e*. (e.g., "XOR Remainder and Zero_Dividend, store in Comp_Comp"), an XOR operation is performed on Remainder 445 (e.g., [0x10201111]) and Zero_Dividend 435 (e.g., [0x33221333]). An XOR operation on two bit-vectors can include performing a number of NAND, OR, and AND operations. The XOR operation on the two bit-vectors can include performing an AND operation on a result of a NAND operation and a result of an OR operation (e.g., A XOR B=(A OR B) AND (A NAND B)). Performing an XOR operation on Remainder 445 (e.g., [0x10201111]) and Zero_Dividend 435 (e.g., [0x33221333]) results in bit-vector [0x23020222], as illustrated as stored in Comp_Comp 431 at 451-5.3.*e* in FIG. 4A. At the end of third iteration 451-5.3, a BlockOR operation is performed on the bit-vector stored in Comp_Comp 431 (e.g., bit-vector [0x23020222]). Since [0x23020222] includes at least one "1" bit-value, an additional iteration is performed (e.g., a fourth iteration 451-5.4).

During a fourth iteration, reference 5.*a*. (e.g., "Copy Row Remainder to Zero_Dividend and Comp_Comp") of the above pseudocode is associated with loading Remainder 445 (e.g., [0x10201111]) into Zero_Dividend 435 and Comp_Comp 431, as illustrated at row 451-5.4.*a*. For example, Zero-Dividend 435 and Comp_Comp 431 now store [0x10201111].

At reference 5.*b* (e.g., "Variable Compare Row Remainder, Divisor, Elem_Mask, output to Subtraction_Mask") of the fourth iteration 451-5.4, the above pseudocode is associated with performing a variable compare operation on Remainder 445 and Divisor 439, using Elem_Mask 441 as a mask to perform the variable compare operation. For example, a number of variable length elements of Remainder 445 (e.g., [0x10201111]) is compared to a number of variable length elements of Divisor 439 (e.g., [0x23322222]). Performing the variable compare on Remainder 445 and Divisor 439 results in bit-vector [0x00000000], as illustrated by Subtraction_Mask 433 at 451-5.4.*b*, which indicates that the seven elements of Remainder 445 are not greater than or equal to each of the corresponding elements of Divisor 439.

At reference 5.*c* (e.g., Using Subtraction_Mask, subtract Divisor from Remainder and output to Remainder), a subtraction operation is performed to subtract a number of elements of Divisor 439 (e.g., [0x23322222]) from a number of elements of Remainder 445 (e.g., [0x10201111]) based on Subtraction_Mask 433 (e.g., [0x00000000]). For example, since the Subtraction_Mask 433 is [0x00000000]), none of the seven elements of Divisor 439 are subtracted from the seven elements of Remainder 445 (e.g., [0x10201111]). As a result, Remainder 445 (e.g., [0x10201111]) remains bit-vector [0x10201111], as illustrated by Remainder 445 at 451-5.4.*c* in FIG. 4A.

At reference 5.*d* (e.g., Using Subtraction_Mask, increment Quotient), a Quotient bit-vector 443 (e.g., [0x33232303]) is incremented one position to the left based on the Subtraction_Mask 433 (e.g., [0x00000000]). Since Subtraction_Mask 433 includes all "0"s, none of the seven elements of Quotient 443 are incremented, as illustrated at 451-5.4.*d*.

At reference 5.*e*. (e.g., "XOR Remainder and Zero_Dividend, store in Comp_Comp"), an XOR operation is performed on Remainder 445 (e.g., [0x10201111]) and Zero_Dividend 435 (e.g., [0x10201111]). An XOR operation on two bit-vectors can include performing a number of NAND, OR, and AND operations. The XOR operation on the two bit-vectors can include performing an AND operation on a result of a NAND operation and a result of an OR operation (e.g., A XOR B=(A OR B) AND (A NAND B)). Performing an XOR operation on Remainder 445 (e.g., [0x10201111]) and Zero_Dividend 435 (e.g., [0x10201111]) results in bit-vector [0x00000000], as illustrated as stored in Comp_Comp 431 at 451-5.4.*e* in FIG. 4A. At the end of fourth iteration 451-5.4, a BlockOR operation is performed on the bit-vector stored in Comp_Comp 431 (e.g., bit-vector [0x00000000]). Since [0x00000000] does not include at least one "1" bit-value the BlockOR loop (e.g., reference numbers 5.*a*-5.*e*) is terminated and the resulting value stored as Quotient 443 (e.g., [0x33232303]) and Remainder 445 (e.g., [0x10201111]) is the resulting quotient and remainder of dividing Dividend 437 (e.g., [0x79865777]) by Divisor 439 (e.g., [0x23322222]).

For example, dividing a first element of Dividend 437 (e.g., [0x77]) by a first element (e.g., [0x22]) of Divisor 439 results in a quotient of [0x03] with a remainder of [0x11], dividing a second element (e.g., [0x7]) of Dividend 437 by a second element (e.g., [0x2]) of Divisor 439 results in a quotient of [0x3] with a remainder of [0x1], dividing a third element (e.g., [0x5]) of Dividend 437 by a third element (e.g., [0x2]) of Divisor 439 results in quotient [0x2] with a remainder of [0x1], dividing a fourth element (e.g., [0x6]) of Dividend 437 by a fourth element (e.g., [0x2]) of Divisor 439 results in quotient [0x3] with a remainder of [0x0], dividing a fifth element (e.g., [0x8]) of Dividend 437 by a fifth element (e.g., [0x3]) of Divisor 439 results in quotient [0x2] with a remainder of [0x2], dividing a sixth element (e.g., [0x9]) of Dividend 437 by a sixth element (e.g., [0x3]) of Divisor 439 results in quotient [0x3] with a remainder of [0x0], and dividing a seventh element (e.g., [0x7]) of Dividend 437 by a seventh element (e.g., [0x2]) of Divisor 439 results in quotient [0x3] with a remainder of [0x1]. Therefore, dividing a number of variable length elements including [0x79865777] (e.g., Dividend bit-vector 437 in FIG. 4A) by a number of variable length elements including [0x23322222] (e.g., Divisor bit-vector 439 in FIG. 4A) results in a quotient bit-vector of [0x33232303] (e.g., Quotient bit-vector 443 illustrated at 451-5.4.*e* in FIG. 4A) with a remainder bit-vector of [0x10201111] (e.g., Remainder 445 illustrated at 451-5.4.*e* in FIG. 4A).

FIG. 4B illustrates a table showing the states of memory cells of an array at a particular phase associated with performing a variable compare in accordance with a number of embodiments of the present disclosure. The below pseudocode represents instructions executable to perform a number of comparison operations in a memory in accordance with a number of embodiments of the present disclosure. The example pseudocode is referenced using reference numbers 5.*b*.i-5.*b*.vii., which correspond to the respective reference numbers 5.*b* in the pseudocode and FIG. 4A. For example, Reference number 5.*b* in the pseudocode described in FIG. 4A includes the reference numbers 5.*b*.i.-5.*b*.vii. below and in FIG. 4B. Further, reference number 5.*b*.i in FIG. 4B, by way of example, corresponds to "Invert Dynamic Mask and Store as Static_Mask" in the pseudocode below, and reference number 5.*b*.ii. in FIG. 4B below corresponds to "Get Remainder >Divisor and Divisor >Remainder into Dest, Dest+1" in the pseudocode.

5.b.i. Invert Dynamic_Mask and Store as Static_Mask
    5.b.ii. Get Remainder >Divisor and Divisor >Remainder into Dest, Dest+1.
    5.b.iii. Replicate right.
    5.b.iv. Get Dest >Dest+1 and Dest+1>Dest into Dest, Dest+1.

5.b.v. Replicate right.
5.b.vi. Replicate left.
5.b.vii. Last left bit replicate left.

The pseudocode referenced by reference numbers 5.b.i-5.b.vii can correspond to a particular iteration of the above referenced pseudocode 5a.-5.e. in FIG. 4A. For example, a first iteration (e.g., 451-5.1) can include a first comparison operation (as described below). A second iteration (e.g., 451-5.2) can include a second comparison operation, etc. FIG. 4B illustrates the values of a number of bit-vectors stored in an array (e.g., 330) and associated with performing a comparison operation. The comparison phase can be comprised of a plurality of replication phases.

In a number of examples, the results of the comparison operation can be stored in an array (e.g., array 330 in FIG. 3) without transferring data via an I/O line (e.g., I/O line 334). In a number of examples, the results of the comparison operation can be transferred to a location other than array 330 in FIG. 3.

The pseudocode referenced at reference number 5.b.i (e.g., Invert Dynamic_Mask and Store as Static_Mask) is associated with performing an INVERT operation on the Dynamic_Mask bit-vector 476 indicating the most significant bits (MSBs) of the constituent elements of the vectors being compared (e.g, Remainder 445 and Divisor 429). Prior to the invert operation, the Elem_Mask (illustrated in FIG. 4A) is stored as the Dynamic_Mask 476. For example, the Dynamic_Mask 476 stores bit-vector [0x88888880]. The result of the INVERT operation (e.g., the inverse of Dynamic_Mask 476) is stored as a different mask bit-vector (e.g., Static_Mask 478). For example, row 451-5.1.b.i. of FIG. 4B illustrates the result (e.g., a hexadecimal bit-vector [7777777F]) of performing an INVERT operation on Dynamic_Mask 476 (e.g., hexadecimal bit-vector [88888880]) being stored as Static_Mask 478.

The pseudocode referenced at reference number 5.b.ii (e.g., Get Remainder >Divisor and Divisor >Remainder into Dest, Dest+1) is associated with identifying differences in the elements from Remainder 445 as compared to the elements from Divisor 439. Identifying differences between Remainder 445 and Divisor 439 can include identifying bits from elements of Remainder 445 that are "1"-bits and associated bits from elements from Divisor 439 that are "0"-bits. The differences between Remainder 445 and Divisor 439 are stored in memory cells that store Dest 492.

The pseudocode reference at reference number 5.b.ii can also be associated with identifying difference in the elements from Divisor 439 as compared to elements from Remainder 445 by identifying bits from elements in Divisor 439 that are 0-bits. The result of identifying differences from Divisor 439 as compared to the elements from Remainder 445 is stored in Dest+1 494. Dest 492 and Dest+1 494 are replicated in a replication phase below to compare the elements in Remainder 445 with the elements in Divisor 439.

Performing the pseudocode referenced at reference number 5.b.ii includes performing an AND operation on the vectors being compared (e.g., Remainder 445 and Divisor 439). For example, Remainder 445 (e.g., [0x79865777]) can be stored in the sensing circuitry corresponding to Comp_Comp 431 and Comp_Comp 431 can be ANDed with Divisor 439 (e.g., [0x23322222]), resulting in bit-vector [0x21020222]. An INVERT operation can be performed on the result (e.g., [0x21020222]) of the AND operation and can be stored in (e.g., written to) the cells corresponding to Dynamic_Mask 476 (e.g., as [0xDCCDDDDD], which is the inverse of [0x21020222]). The result (e.g., [0xDC-CDDDDD]) of the INVERT operation can remain in the sensing circuitry (e.g., as Comp_Comp 431).

Identifying bits from elements from Remainder 445 that are 1-bits and associated bits from elements from Divisor 439 that are 0-bits includes performing an AND operation on the result (e.g., a bit-vector [0xDCCDDDDD]) of the INVERT operation and Remainder (e.g., a bit-vector [0x79865777]), resulting in [0x58845555]. An OR operation can be performed on the result (e.g., a bit-vector [0x58845555]) of the AND operation and Dest 492 (e.g., a bit-vector [0x00000000]). The result (e.g., a bit-vector [0x58845555]) is stored in the memory cells corresponding to Dest 492.

The 1-bits in Dest 492 (a binary bit-vector [0101, 1000, 1000, 0100, 0101, 0101, 0101 0101]) indicate that associated bits in Remainder 445 are greater than an associated bit in Divisor 439. For example, Dest 492 (e.g., a binary bit-vector [0101, 1000, 1000, 0100, 0101, 0101, 0101 0101]) indicates that each of the seven elements in Remainder 445 has at least one 1-bit. For example, the first element (e.g., [0101 0101]) has a 1-bit in the first, third, fifth, and seventh index (e.g., the first index being the least significant bit and the eighth index being the most significant bit). For example, Dest 492 can indicate that the first, third, fifth, and seventh index in the first element in Remainder 445 is greater than a first, third, fifth, and seventh index in the first element in Divisor 439.

Dest 492 (e.g., a binary bit-vector [0101, 1000, 1000, 0100, 0101, 0101, 0101 0101]) can also indicate that the second element (e.g., bit-vector [0101]) in Remainder 445 has a 1-bit in the first index and the third index. For example, Dest 492 can also indicate that the second index in the second element from Remainder 445 is greater than the second index in the second element from Divisor 439.

Identifying bits from elements in Divisor 439 that are 1-bits and associated bits from elements from Remainder 445 that are 0-bits includes storing Dynamic_Mask 476 in the sensing circuitry and performing an AND operation on Comp_Comp 431 (e.g., a bit-vector [0xDCCDDDDD]) and Divisor 439 (e.g., a bit-vector [0x23322222]). An OR operation can be performed on the results (e.g., a bit-vector [0x00000000]) of the AND operation and Dest+1 494 (e.g., bit-vector [0x00000000]) stored in additional memory cells coupled to an additional access line, such as described in connection with FIG. 3. The results (e.g., a bit-vector [0x00000000]) of the OR operation can be stored in memory cells that store Dest+1 494 . The resulting bit-vector [0x00000000] indicates that there are no 1-bits, indicating there are no bits in Divisor 439 greater than bits in Remainder 445.

The pseudocode referenced at reference number 5.b.ii is also associated with preparing for a replication phase (e.g., a duplicate, 'copy to operation') associated with reference number 5.b.iii. Preparing for a replication phase can include performing an INVERT operation on Static_Mask 478 (e.g., [0x7777777F]) and storing the result in the memory cells corresponding to Dynamic_Mask 476 ([e.g., resulting bit-vector [0x88888880]). Preparing for a replication phase can also include storing Dynamic_Mask 476 (e.g., [0x88888880]) in the sensing circuitry (e.g., in the compute components and/or sense amplifiers corresponding to Comp_Comp 431) and performing a right SHIFT operation on Comp_Comp 431 (e.g., resulting in bit-vector [0x44444440]). An AND operation can be performed on the result (e.g., bit-vector [0x44444440]) of the right SHIFT operation and Static_Mask 478 (e.g., bit-vector [0x7777777F]). The result (e.g., bit-vector [0x44444440])

of the AND operation can be stored in the memory cells corresponding to Dynamic_Mask 476.

The pseudocode referenced at reference number 5.*b*.iii (e.g., "Replicate right") is associated with a replication phase. A replication phase can include a right or left replication phase. A replication phase can replicate a given bit to a number of bits that are associated with a lower index or to a number of bits that are associated with a higher index. As used herein, replicate is used to denote the change of a value of a given bit to the value of a different bit. For example, given a bit-vector [0100] that has a 1-bit in the third index and 0-bits in the first index, the second index, and the fourth index, the value of the third index (e.g., a 1-bit) can be replicated to the right and result in a bit-vector [0110]. As used herein, the 1-bits in Dest 492 and Dest+1 494 are replicated to setup a comparison of Dest 492 and Dest+1 494.

The psuedocode referenced at reference number 5.*b*.iii is associated with replicating bits to the right (e.g., replicating a value of a bit to a number of bits that are associated with a lower index). A replication phase can include performing a number of iterations of operations (e.g., "loop") via a FOR loop, a WHILE loop, and/or a DO loop, among other possible loop structures. As used herein, a "loop" is defined as a control flow statement that allows a number of operations to be performed in a number of iterations based on a boolean condition. The "loop" can be used to perform a number of operations based on a BLOCKOR operation (e.g., boolean condition). For example, a number of operations that are associated with a replication phase can be performed repeatedly while a BLOCKOR operation returns a true value (e.g., a "1"). A BLOCKOR operation can be performed on Comp_Comp 431 (as described above).

As such, in a number of examples, a BLOCKOR operation results in (e.g., returns) a "1" if any of the bits of the bit-vector on which the operation is being performed are a "1" and results in a "0" if none of the bits of the bit-vector on which the operation is being performed are a "1." Therefore, a BLOCKOR operation is effectively performing a logic "OR" operation on the particular bit-vector (e.g., the logic operation A OR B returns a true (e.g., "1") if either A or B is a "1" and false (e.g., "0") if neither A or B is a "1").

The pseudocode reference at reference number 5.*b*.iii is associated with using the Dynamic_Mask 476 as a counter in association with the BLOCKOR operation. For example, Dynamic_Mask 476 can be used to determine how many times a particular bit is replicated. Dynamic_Mask 476 (e.g., a bit-vector [0x44444440]) can be stored in the sensing circuitry. After each iteration of the "loop" the Dynamic_Mask 476 can be stored in the sensing circuitry, a SHIFT operation can be performed on Comp_Comp 431 (e.g., a bit-vector [0x44444440]) and an AND operation can be performed on the result (e.g., a bit-vector [0x22222220]) of the SHIFT operation and the Static_Mask 478 (e.g., a bit-vector [0x7777777F]). The Static_Mask 478 can be used to perform the AND operation to restrict bits from an element from being shifted (e.g., moved) to a different element. The result (e.g., a bit-vector [0x22222220]) of the AND operation can be stored in memory cells that store the Dynamic_Mask 476. After a number of iterations the Dynamic_Mask 476 is a bit-vector [0x00000000]. The Dynamic_Mask 476 will be stored in the sensing circuitry and the BLOCKOR operation will return false (e.g., there are no 1-bits in Comp_Comp 431) when completed.

Each iteration of the "loop" that is associated with reference number 5.*b*.iii can include performing a number of operations. The number of operations can include performing SHIFT operations, OR operations, and/or AND operations to replicate Dest 492 to the right.

Replicating Dest 492 can include storing Dest 492 in the sensing circuitry. A right SHIFT operation can be performed on Comp_Comp 431. An OR operation can be performed on the result of the SHIFT operation and Dest 492. An AND operation can be performed on the result of the OR operation and Static_Mask 478. The result of the AND operation can be stored in memory cells that store Dest 492.

Replicating Dest+1 494 can include storing Dest+1 494 in the sensing circuitry. A right SHIFT operation can be performed on Comp_Comp 431. An OR operation can be performed on the result of the SHIFT operation and Dest+1 494. An AND operation can be performed on the result of the OR operation and Static_Mask 478. The result of the AND operation can be stored in memory cells that store Dest+1 494.

Dest 492 is a bit-vector [0x7FF7777F] after performing a number of iterations of operations associated with the pseudocode referenced in reference number 5.*b*.iii.

The pseudocode referenced at reference number 5.*b*.iv. (e.g., Get Dest >Dest+1 and Dest+1>Dest into Dest, Dest+1) is associated with identifying differences in Dest 492 as compared to Dest+1 494 by identifying bits from Dest 492 that are 1-bits and associated bits from Dest+1 494 that are 0-bits. The pseudocode referenced at reference number 5.*b*.iv. can also be associated with identifying differences in Dest+1 494 as compared to Dest 492 by identifying bits from Dest+1 494 that are 1-bits and associated bits from Dest 492 that are 0-bits. The operations performed to identify the differences in Dest 492 as compared to Dest+1 and identifying differences in Dest+1 494 as compared to Dest 492 can be analogous to the operations performed in association with reference number 5.*b*.ii.

For example, Dest 492 can be stored in the sensing circuitry. An AND operation can be performed on Comp_Comp 431 (e.g., a hexadecimal bit-vector [0x7FF7777F]) and Dest+1 494 (e.g., a bit-vector [0x00000000]), resulting in bit-vector [0x00000000]. A result (e.g., a bit-vector [0xFFFFFFFF]) of an INVERT operation that is performed on the result (e.g., a bit-vector [0x00000000]) of the AND operation can be stored in memory cells that store Dynamic_Mask 476 and/or the sensing circuitry.

Identifying bits from Dest 492 that are 1-bits and associated bits from Dest+1 491 that are 0-bits includes performing an AND operation on the result (e.g., a bit-vector [0xFFFFFFFF]) of the INVERT operation and Dest 492 (e.g., a bit-vector [0x7FF7777F]). The result (e.g., a bit-vector [0x7FF7777F]) is stored in the memory cells that store Dest 492.

Identifying bits from Dest+1 494 that are 1-bits and associated bits from Dest 492 that are 0-bits includes storing Dynamic_Mask 476 in the sensing circuitry and performing an AND operation on Comp_Comp 431 (e.g., a bit-vector [0xFFFFFFFF]) and Dest+1 494 (e.g., a bit-vector [0x00000000]). The results (e.g., a bit-vector [0x00000000]) of the AND operation can be stored in memory cells that store Dest+1 494.

The pseudocode referenced at reference number 5.*b*.iv. is also associated with preparing for a replication phase associated with reference number 5.*b*.v. Preparing for a replication phase can include performing an INVERT operation on Static_Mask 478 and storing the result (e.g., [0x88888880]) in memory cells that store Dynamic_Mask 476. Preparing for a replication phase can also include storing Dest 492 (e.g., a bit-vector [0x7FF7777F]) in the sensing circuitry and performing an OR operation on Comp_Comp 431 (e.g., bit-vector [0x7FF7777F]) and Dest+1 494 (e.g., a bit-vector [0x00000000]).

The pseudocode referenced at reference number 5.*b*.v. (e.g., "Replicate right") is associated with a replication phase. The replication phase associated with reference number 5.*b*.v. is analogous to the replication phase associated with reference number 5.*b*.iii. A replication phase referenced in reference number 5.*b*.v. replicates bits to the right (e.g., replicating a value of a bit to a number of bits that are associated with a lower index). A replication phase can include performing a number of iterations of operations via a "loop". The "loop" can be used to perform a number of operations based on a BLOCKOR operation (e.g., boolean condition). For example, a number of operations that are associated with a replication phase can be performed repeatedly while a BLOCKOR operation returns a true value (e.g., a "1"). A BLOCKOR operation can be performed on Comp_Comp 431.

The pseudocode referenced at reference number 5.*b*.v. is associated with using the Dynamic_Mask 476 as a counter in association with the BLOCKOR operation after a first iteration of the "loop". Dynamic_Mask 476 (e.g., bit-vector [0x88888880]) can be stored in the sensing circuitry at each iteration (e.g., at the end of each iteration) of the "loop". A SHIFT operation can be performed on Comp_Comp 431 (e.g., a bit-vector [0x88888880]). An AND operation can be performed on the result (e.g., a bit-vector [0x44444440]) of the SHIFT operation and Static_Mask 478 (e.g., a bit-vector [0x7777777F]). The result (e.g., a bit-vector [0x44444440]) of the AND operation can be stored in memory cells that store the Dynamic_Mask 476. After a number of iterations the Dynamic_Mask 476 will be a bit-vector [0x00000000]. The Dynamic_Mask 476 will be stored in the sensing circuitry and the BLOCKOR operation will return false (e.g., there are no 1-bits in Comp_Comp 431) when the Dynamic_Mask 476 is [0x00000000].

Each iteration of the "loop" that is associated with reference number 5.*b*.v. can include performing a number of operations. The number of operations can include performing SHIFT operations, OR operations, and/or AND operations to replicate Dest 492 and/or Dest+1 494 to the right.

Replicating Dest 492 can include storing Dest 492 in the sensing circuitry. A right SHIFT operation can be performed on Comp_Comp 431. An OR operation can be performed on the result of the SHIFT operation and Dest 492. An AND operation can be performed on the result of the OR operation and Static_Mask 478. The result of the AND operation can be stored in memory cells that store Dest 492.

Replicating Dest+1 494 can include storing Dest+1 494 in the sensing circuitry. A right SHIFT operation can be performed on Comp_Comp 431. An OR operation can be performed on the result of the SHIFT operation and Dest+1 494. An AND operation can be performed on the result of the OR operation and Static_Mask 478. The result of the AND operation can be stored in memory cells that store Dest+1 494.

Dest 492 can be a bit-vector [0x7FF7777F] and Dest+1 494 can be a bit-vector [0x00000000] after performing a number of iterations of operations associated with the pseudocode referenced at reference number 5.*b*.v. The pseudocode referenced at reference number 5.*b*.v is also associated with preparing for a subsequent replication phase associated with reference number 5.*b*.vi. Preparing for a replication phase can include performing an INVERT operation on Static_Mask 478 and storing the result in memory cells that store Dynamic_Mask 476. Preparing for a replication phase can also include storing Dest 492 (e.g., a bit-vector [0x7FF7777F]) in the sensing circuitry and performing an OR operation on Comp_Comp 431 (e.g., a bit-vector [0x7FF7777F]) and Dest+1 494 (e.g., a bit-vector [0x00000000]). The result (e.g., a bit-vector [0x7FF7777F]) of the OR operation can be stored in the sensing circuitry.

The pseudocode referenced at reference number 5.*b*.vi. (e.g., "Replicate left") is associated with a replication phase. A replication phase corresponding to reference number 5.*b*.vi. involves replicating bits to the left (e.g., replicating a value of a bit to a number of bits that are associated with a higher index). A replication phase can include performing a number of iterations of operations via a "loop". The "loop" can be used to perform a number of operations based on a BLOCKOR operation (e.g., boolean condition). For example, a number of operations that are associated with a replication phase can be performed repeatedly while a BLOCKOR operation returns a true value (e.g a "1").

The pseudocode reference at reference number 5.*b*.vi. is associated with using the Dynamic_Mask 476 as a counter in association with the BLOCKOR operation after a first iteration of the "loop". Dynamic_Mask 476 (e.g., a bit-vector [0x88888880]) can be stored in the sensing circuitry at each iteration (e.g., at the end of each iteration) of the "loop". A SHIFT operation can be performed on Comp_Comp 431 (e.g., a bit-vector [0x88888880]). An AND operation can be performed on the result (e.g., a bit-vector [0x44444440]) of the SHIFT operation and Static_Mask 478 (e.g., a bit-vector [0x7777777F]). The result (e.g., a bit-vector [0x44444440]) of the AND operation can be stored in memory cells that store the Dynamic_Mask 476. After a number of iterations the Dynamic_Mask 476 will be a bit-vector [0x00000000]. The Dynamic_Mask 476 will be stored in the sensing circuitry and the BLOCKOR operation will return false (e.g., there are no 1-bits in Comp_Comp 431).

Each iteration of the "loop" that is associated with reference number 5.*b*.vi. can include performing a number of operations. The number of operations can include performing SHIFT operations (e.g., left SHIFT operations), OR operations, and/or AND operations to replicate Dest 492 and/or Dest+1 494 to the left.

Replicating Dest 492 can include storing Dest 492 in the sensing circuitry (e.g., such that the value of Comp_Comp 431 is the same as the value of Dest 492). A left SHIFT operation can be performed on Comp_Comp 431. An OR operation can be performed on the result of the left SHIFT operation (e.g., which is stored as Comp_Comp 431) and Dest 492. An AND operation can be performed on the result of the OR operation (e.g., which is stored as Comp_Comp 431) and Static_Mask 478. The result of the AND operation can be stored in memory cells corresponding to Dest 492 (e.g., by copying the value of Comp_Comp 431 to Dest 492).

Replicating Dest+1 494 can include storing Dest+1 494 in the sensing circuitry. A left SHIFT operation can be performed on Comp_Comp 431. An OR operation can be performed on the result of the left SHIFT operation and Dest+1 494. An AND operation can be performed on the result of the OR operation and Static_Mask 478. The result of the AND operation can be stored in memory cells that store Dest+1 494.

Dest 492 can be a bit-vector [0x7FF7777F] and Dest+1 494 can be a bit-vector [0x00000000] after performing a number of iterations of operations associated with the pseudocode referenced at reference number 5.*b*.vi.

The pseudocode referenced at reference number 5.b.vii. (e.g., "Last left bit replicate left.") is associated with replicating a bit with the next to highest index (e.g., a bit with an index that has a value of 7) once to the left. The replication reference in reference number 5.b.vii. replicates bits to the left (e.g., replicating a value of a bit to a number of bits that are associated with a higher index).

Replicating Dest 492 to the left can include storing Dest 492 in the sensing circuitry. A left SHIFT operation can be performed on Comp_Comp 431 (e.g., a bit-vector [0x7FF7777F]). An OR operation can be performed on the result (e.g., a bit-vector [0xFFEEEEFE]) of the left SHIFT operation and Dest 492. The result (e.g., a bit-vector [0xFFFFFFFF]) of the OR operation can be stored in memory cells that store Dest 492 and as the Subtraction_ Mask 433.

Replicating Dest+1 494 can include storing Dest+1 494 in the sensing circuitry. A left SHIFT operation can be performed on Comp_Comp 431 (e.g., a bit-vector [0x00000000]). An OR operation can be performed on the result (e.g., a bit-vector [0x00000000]) of the left SHIFT operation and Dest+1 494. The result (e.g., a bit-vector [0x00000000]) of the OR operation can be stored in memory cells that store Dest+1 494.

Dest 492 (e.g., a bit-vector [0xFFFFFFFF]) indicates that each of the seven elements (e.g., elements, [0x7], [0x9], [0x8], [0x6], [0x5], [0x7], and [0x77]) in Remainder 445 are greater than the seven elements (e.g., elements [0x2], [0x3], [0x3], [0x2], [0x2], [0x2], and [0x22], respectively) in Divisor 439. Dest+1 494 (e.g., a bit-vector [0x00000000]) indicates that each of the seven elements in Divisor 439 are not greater than each of the seven elements of Remainder 445. While not demonstrated in this example, if a corresponding element in Dest 492 and Dest+1 494 are both element [0x00], for example, then the corresponding elements would be indicated as equal (e.g., neither are greater than the other). For example, the "00" bits with a same index in both Dest+1 494 and Dest 492 indicate that the corresponding elements from Remainder 445 and Divisor 439 would have been equal. Embodiments however, are not limited to the order of the sequence of instructions in the pseudocode in this example.

The functionality of the sensing circuitry 250-2 of FIG. 2A is described below and summarized in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 and/or 205-2).

Figure 5A:
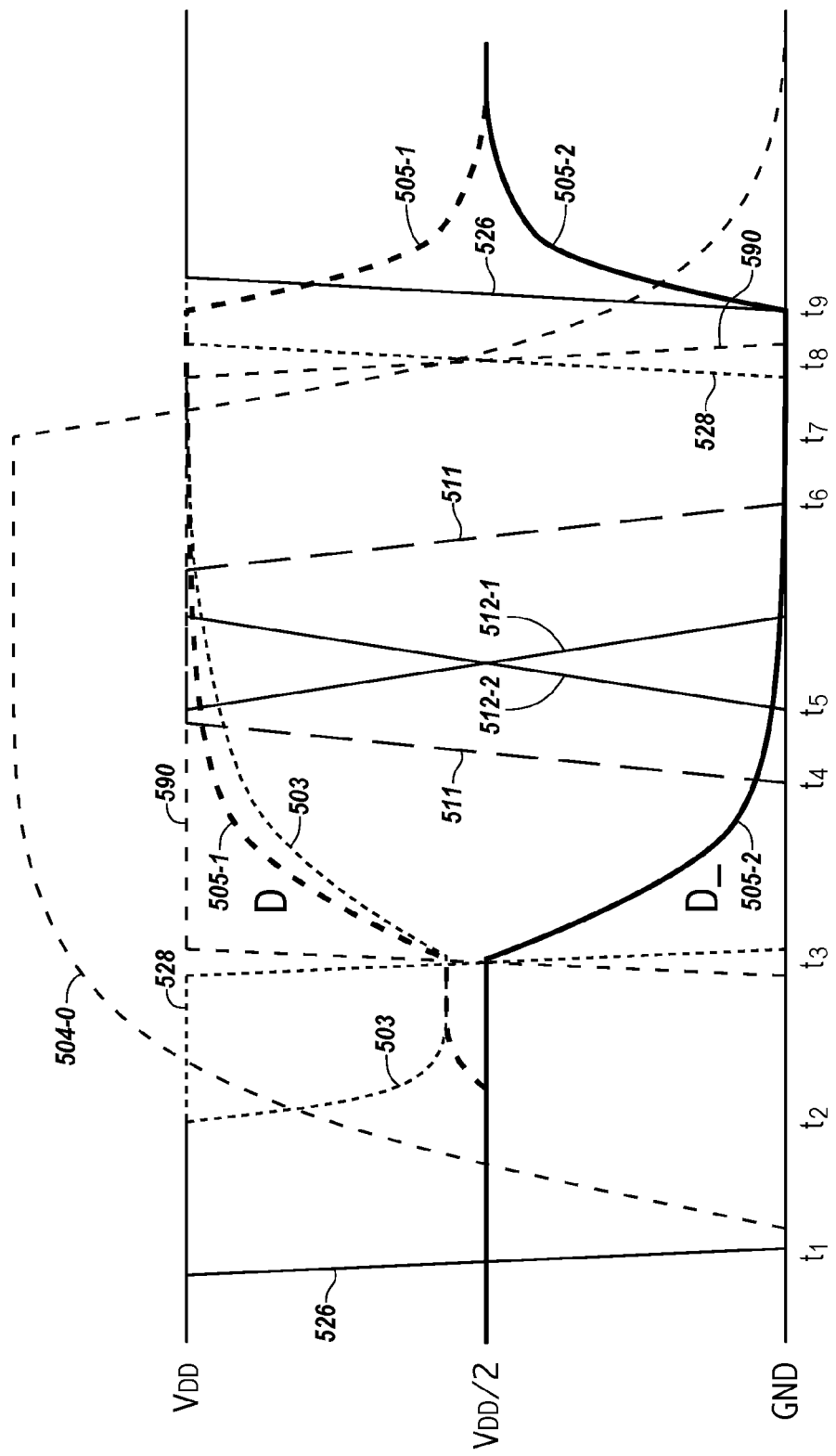
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250-2 of FIG. 2A is described below with respect to performing logical operations and initially storing a result in the compute component 231-2 (e.g., secondary latch of the accumulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground for accessing I/O lines).

In the example illustrated in FIG. 5a, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 shown in FIG. 2A if the cell is a 1T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy. However, the energy associated with enabling/disabling the row signal 504-0 is distributed over the plurality of memory cells coupled to the row.

At time $t_3$, the sense amplifier (e.g., 206-2 shown in FIG. 2A) is enabled. As shown, a positive control signal 590, e.g., corresponding to ACT 265 shown in FIG. 2B, goes high and the negative control signal 528, e.g., corresponding to RnIF 228 shown in FIG. 2B, goes low. This amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line DJ. As such, the sensed data value is stored in the primary latch of sense amplifier 206-2. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206-2 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the accumulator negative control signal 512-1 (e.g., Accumb) and the accumulator positive control signal 512-2 (e.g., Accum) are activated via respective control lines 212-1 and 212-2 shown in FIG. 2A. As described below, the accumulator control signals ACCUMB 512-1 and ACCUM 512-2 may remain activated for subsequent operation phases. As such, in this example, activating the control signals ACCUMB 512-1 and ACCUM 512-2 enables the secondary latch (e.g., accumulator) of compute component 231-2 shown in FIG. 2A. The sensed data value stored in sense amplifier 206-2 is transferred (e.g., copied) to the secondary latch, including the dynamic latch and static latch 264, as shown in FIG. 2A.

At time $t_6$, the Passd control signal 511 (and the Passdb control signal) goes low thereby turning off the pass transistors (if present). However, since the accumulator control signals ACCUMB 512-1 and ACCUM 512-2 remain activated, an accumulated result is stored (e.g., latched) in the secondary latches (e.g., accumulator). At time $t_7$, the row signal 504-0 is deactivated, and the array sense amps are disabled at time $t_8$ (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
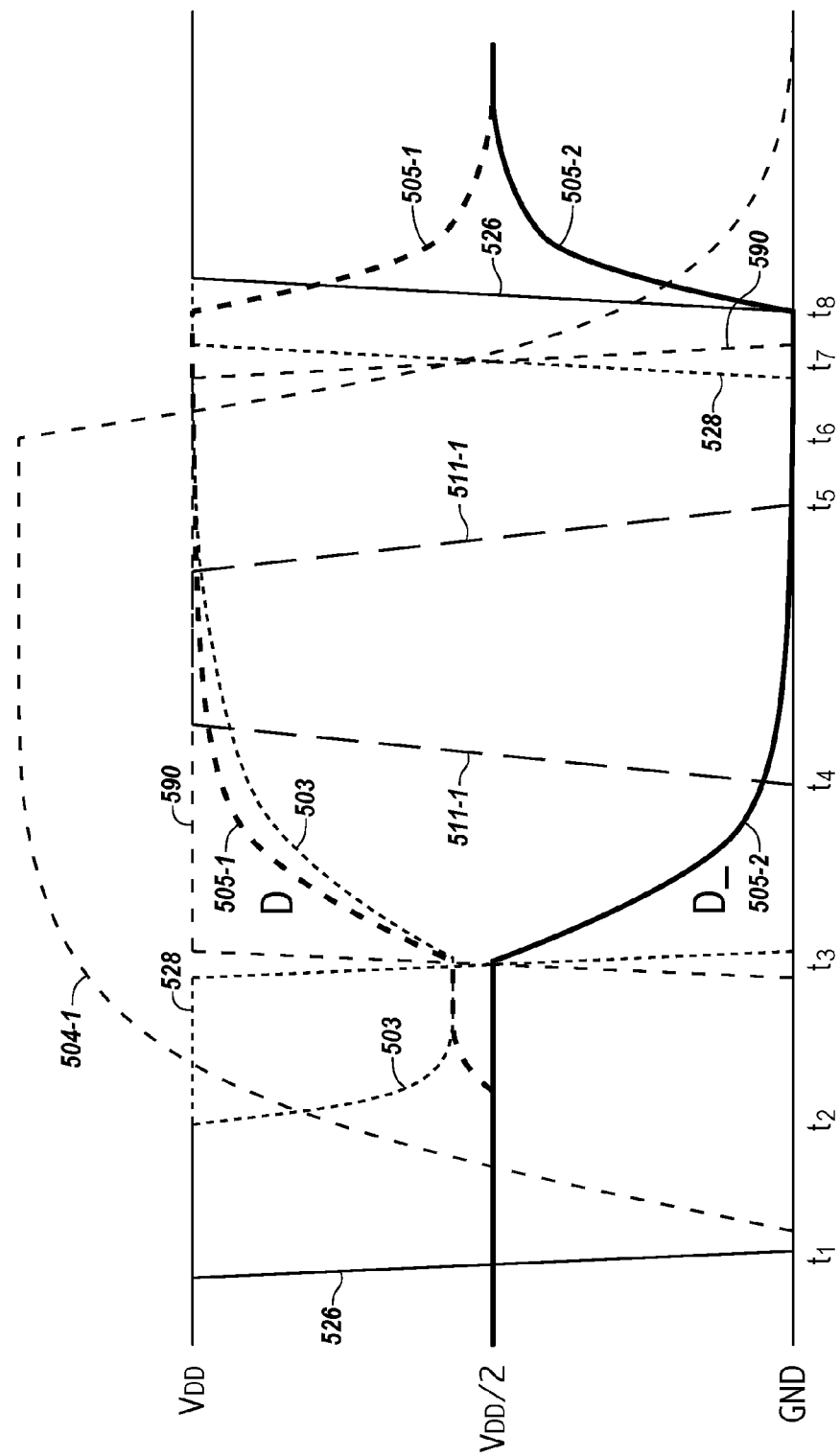
Figure 5C:
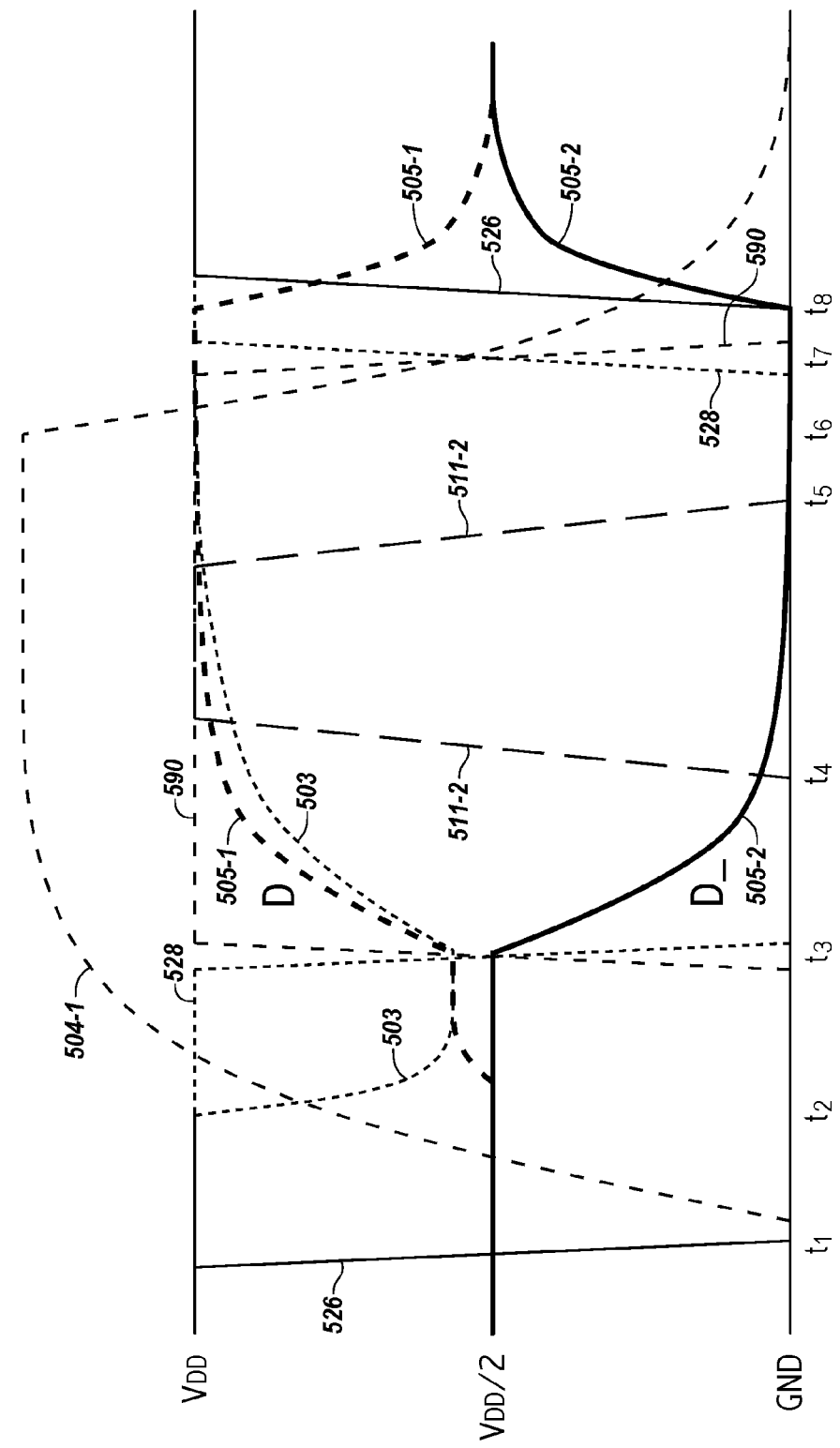

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to FIG. 5C one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy. However, the energy associated with activating/deactivating the row signal 504-1 can be amortized over the plurality of memory cells coupled to the row.

At time $t_3$, the sense amplifier (e.g., 206-2 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low). This amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 512-1 (Accumb) and 512-2 (Accum) were activated during the initial operation phase described with respect to FIG. 5A, and they remain activated during the intermediate operation phase(s).

Since the accumulator was previously enabled, activating only Passd (511-1 as shown in FIG. 5B) results in accumulating the data value corresponding to the voltage signal 505-1 shown in FIG. 5B corresponding to data line D. Similarly, activating only Passdb (511-2 as shown in FIG. 5C) results in accumulating the data value corresponding to the voltage signal 505-2 corresponding to data line D_. For instance, in an example AND/NAND operation shown in the timing diagram illustrated in FIG. 5B in which only Passd (511-1) is activated, if the data value stored in a second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 5C in which only Passdb 511-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 505-2 on D_ is setting the true, e.g., "1", data value of the accumulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 5B or 5C can be repeated in order to accumulate results from a number of additional rows. As an example, the sequence of timing diagram illustrated in FIGS. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
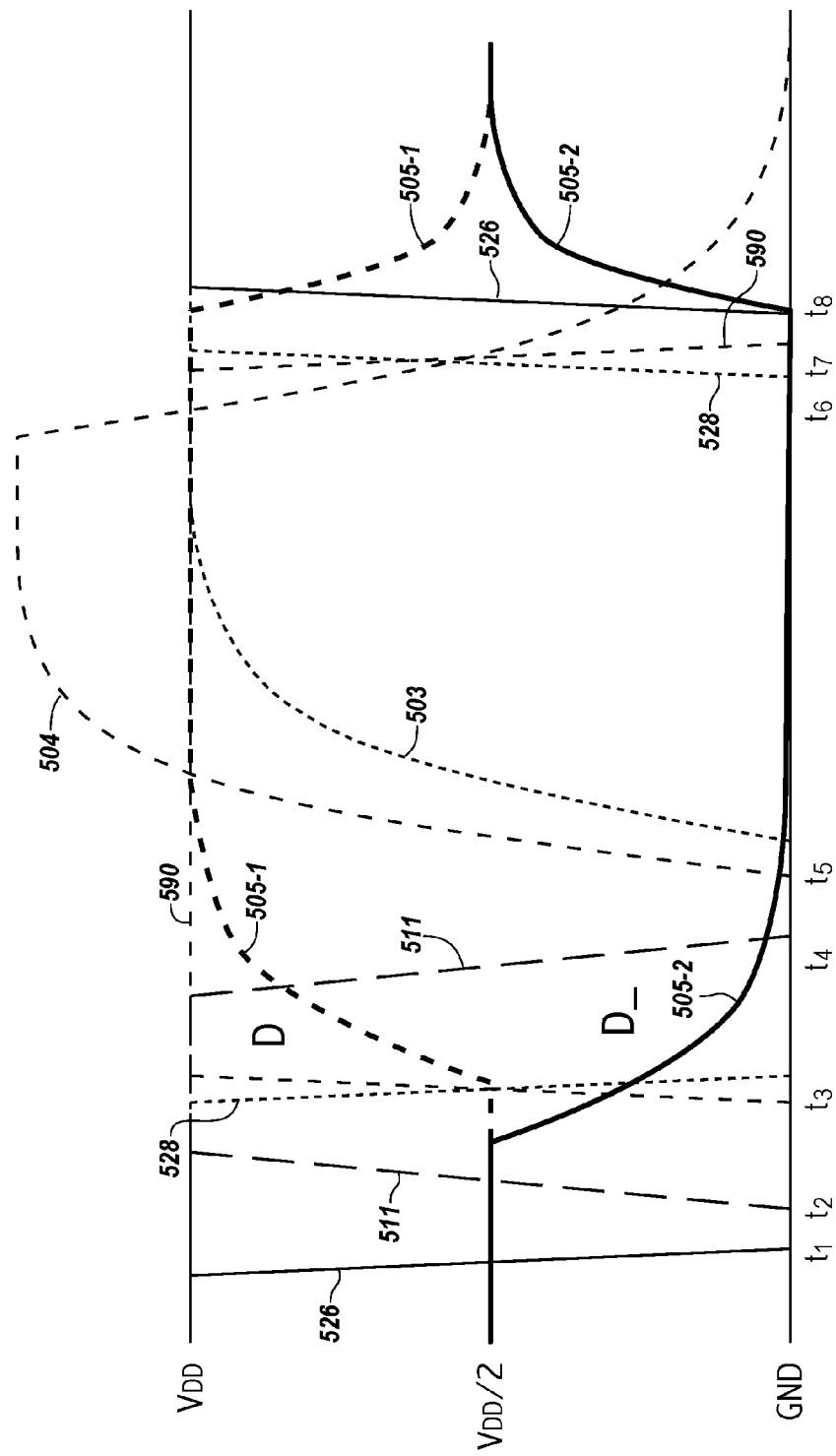

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 2 shown below indicates the Figures corresponding to the sequence of operation phases associated with performing a number of R-input logical operations in accordance with a number of embodiments described herein.

TABLE 2

| Operation | FIG. 5A | FIG. 5B | FIG. 5C | FIG. 5D |
|---|---|---|---|---|
| AND | First phase | R-1 iterations | | Last phase |
| NAND | First phase | R-1 iterations | | |

TABLE 2-continued

| Operation | FIG. 5A | FIG. 5B | FIG. 5C | FIG. 5D |
|---|---|---|---|---|
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time t2, the Passd control signal 511 (and Passdb signal) is activated for an AND or OR operation.

Activating the Passd control signal 511 (and Passdb signal) (e.g., in association with an AND or OR operation) transfers the accumulated output stored in the secondary latch of compute component 231-2 shown in FIG. 2A to the primary latch of sense amplifier 206-2. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206-2 is then enabled (e.g., a positive control signal 590 (e.g., corresponding to ACT 265 shown in FIG. 2B) goes high and the negative control signal 528 (e.g., corresponding to RnIF 228 shown in FIG. 2B) goes low), which amplifies the differential signal between data lines D and D such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206-2 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time t3, the positive control signal 590 and the negative control signal 528 being deactivated (e.g., signal 590 goes high and signal 528 goes low) to disable the sense amplifier 206-2 shown in FIG. 2A. At time t4 the Passd control signal 511 (and Passdb signal) that was activated at time t2 is deactivated. Embodiments are not limited to this example. For instance, in a number of embodiments, the sense amplifier 206-2 shown in FIG. 2A may be enabled subsequent to time t4 (e.g., after he Passd control signal 511 (and Passdb signal) are deactivated).

As shown in FIG. 5D, at time t5, a selected row is enabled (e.g., by row activation signal 504 going high, which drives the capacitor of the selected cell to the voltage corresponding to the logic value stored in the accumulator. At time t6 the selected row is disabled. At time t7 the sense amplifier 206-2 shown in FIG. 2A is disabled (e.g., positive control signal 528 and negative control signal 590 are deactivated in FIG. 5D), and at time t8 equilibration occurs (e.g., signal 526 is activated and the voltages on the complementary data lines 505-1 (D) and 505-2 (DJ are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250-2 of FIG. 2A as described previously and summarized once again in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 (D) and/or 205-2 (D_)

Figure 6A:
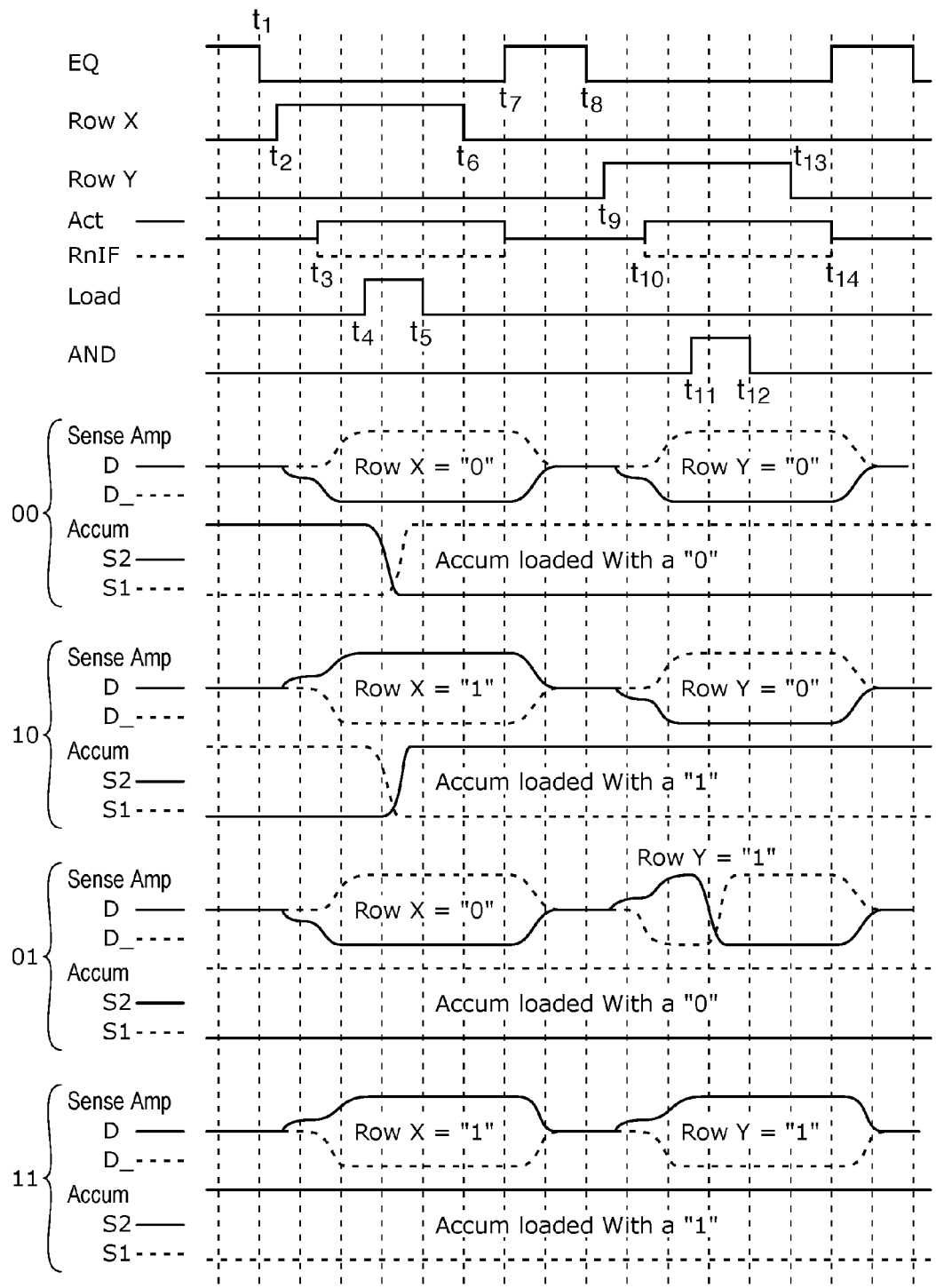
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250-2 in FIG. 2A) to perform the AND logical operation. "EQ" corresponds to an equilibrate signal applied to the sense amp 206-2, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206-2, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D_corresponding to sense amp 206-2 and on the nodes S1 and S2 corresponding to the compute component 231-2 (e.g., accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
Copy Row X into the Accumulator:
Deactivate EQ
Open Row X Fire Sense Amps (after which Row X data resides in the sense amps)

Activate LOAD (sense amplifier data (Row X) is transferred to nodes S1 and S2 of the Accumulator and resides there dynamically)

Deactivate LOAD

Close Row X

Precharge

In the pseudo code above, "Deactivate EQ" indicates that an equilibration signal (EQ signal shown in FIG. 6A) corresponding to the sense amplifier 206-2 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 6A. When the voltage signal applied to ROW X reaches the threshold voltage (Vt) of the access transistor (e.g., 202-4) corresponding to the selected cell, the access transistor turns on and couples the data line (e.g., 205-2 (D_) to the selected cell (e.g., to capacitor 203-4) which creates a differential voltage signal between the data lines.

After Row X is enabled, in the pseudo code above, "Fire Sense Amps" indicates that the sense amplifier 206-2 is enabled to set the primary latch, as has been described herein, and subsequently disabled. For example, as shown at $t_3$ in FIG. 6A, the ACT positive control signal (e.g., 265 shown in FIG. 2B) goes high and the RnIF negative control signal (e.g., 228 shown in FIG. 2B) goes low, which amplifies the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic is placed on the complementary data line 205-2 (D_). The sensed data value is stored in the primary latch of sense amplifier 206-2. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-4, corresponding to Row X, is coupled to the complementary data line D_, while the memory cell including storage element 203-3, corresponding to Row Y, is coupled to data line D. However, as can be seen in FIG. 2A, the charge stored in memory cell 201-4 (corresponding to Row X) corresponding to a "0" data value causes the voltage on data line D_ (to which memory cell 201-4 is coupled) to go high and the charge stored in memory cell 201-4 corresponding to a "1" data value causes the voltage on data line D_ to go low, which is opposite correspondence between data states and charge stored in memory cell 201-4, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the accumulator of the compute component 231-2.

The sensed data value stored in the sense amplifier 206-2 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at is in FIG. 6A to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206-2 and the secondary latch of the compute component 231-2 shown in FIG. 2A) and the second data value (stored in a memory cell 201-3 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 201-4 coupled to Row X 204-X) and the second data value (e.g., the data value stored in the memory cell 201-3 coupled to Row Y 204-Y) are summarized below. Example pseudo code associated with "ANDing" the data values can include:

Deactivate EQ

Open Row Y

Fire Sense Amps (after which Row Y data resides in the sense amps)

Close Row Y

The result of the logic operation, in the next operation, will be placed on the sense amp, which will overwrite any row that is active.

Even when Row Y is closed, the sense amplifier still contains the Row Y data value.

Activate AND

This results in the sense amplifier being written to the value of the function (e.g., Row X AND Row Y)

If the accumulator contains a "0" (i.e., a voltage corresponding to a "0" on node S2 and a voltage corresponding to a "1" on node S1), the sense amplifier data is written to a "0"

If the accumulator contains a "1" (i.e., a voltage corresponding to a "1" on node S2 and a voltage corresponding to a "0" on node S1), the sense amplifier data remains unchanged (Row Y data)

This operation leaves the data in the accumulator unchanged.

Deactivate AND

Precharge

In the pseudo code above, "Deactivate EQ" indicates that an equilibration signal corresponding to the sense amplifier 206-2 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-3) corresponding to the selected cell, the access transistor turns on and couples the data line (e.g., D_205-2) to the selected cell (e.g., to capacitor 203-3) which creates a differential voltage signal between the data lines.

After Row Y is enabled, in the pseudo code above, "Fire Sense Amps" indicates that the sense amplifier 206-2 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic state is on complementary data line 205-2 (D_). As shown at $t_{10}$ in FIG. 6A, the ACT positive control signal (e.g., 265 shown in FIG. 2B) goes high and the RnIF negative control signal (e.g., 228 shown in FIG. 2B) goes low to fire the sense amps. The sensed data value from memory cell 201-3 is stored in the primary latch of sense amplifier 206-2, as previously described. The secondary latch still corresponds to the data value from memory cell 201-4 since the dynamic latch is unchanged.

After the second data value sensed from the memory cell 201-3 coupled to Row Y is stored in the primary latch of sense amplifier 206-2, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 201-3 from the data line 205-1 (D).

After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231-2 and the second data value (e.g., Row Y) stored in the sense amplifier 206-2, if the dynamic latch of the compute component 231-2 contains a "0" (i.e., a voltage corresponding to a "0" on node S2 and a voltage corresponding to a "1" on node S1), the sense amplifier data is written to a "0" (regardless of the data value previously stored in the sense amp). This is because the voltage corresponding to a "1" on node S1 causes transistor 209-1 to conduct thereby coupling the sense amplifier 206-2 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value. Thus the configuration of the sensing circuitry causes the "0" result to be written and initially stored in the sense amplifier 206-2. This operation leaves the data value in the accumulator unchanged (e.g., from Row X).

If the secondary latch of the accumulator contains a "1" (e.g., from Row X), then the result of the AND operation depends on the data value stored in the sense amplifier 206-2 (e.g., from Row Y). The result of the AND operation should be a "1" if the data value stored in the sense amplifier 206-2 (e.g., from Row Y) is also a "1," but the result of the AND operation should be a "0" if the data value stored in the sense amplifier 206-2 (e.g., from Row Y) is a "0." The sensing circuitry 250-2 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206-2 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206-2, "Deactivate AND" in the pseudo code above indicates that the AND control signal goes low as shown at $t_{12}$ in FIG. 6A, causing pass transistor 207-1 to stop conducting to isolate the sense amplifier 206-2 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal going high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (DJ shown in FIG. 2A) coupled to the sense amplifier (e.g., 206-2 shown in FIG. 2A) and the behavior of voltage signals on nodes S1 and S1 of the secondary latch of the compute component (e.g., 231-2 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
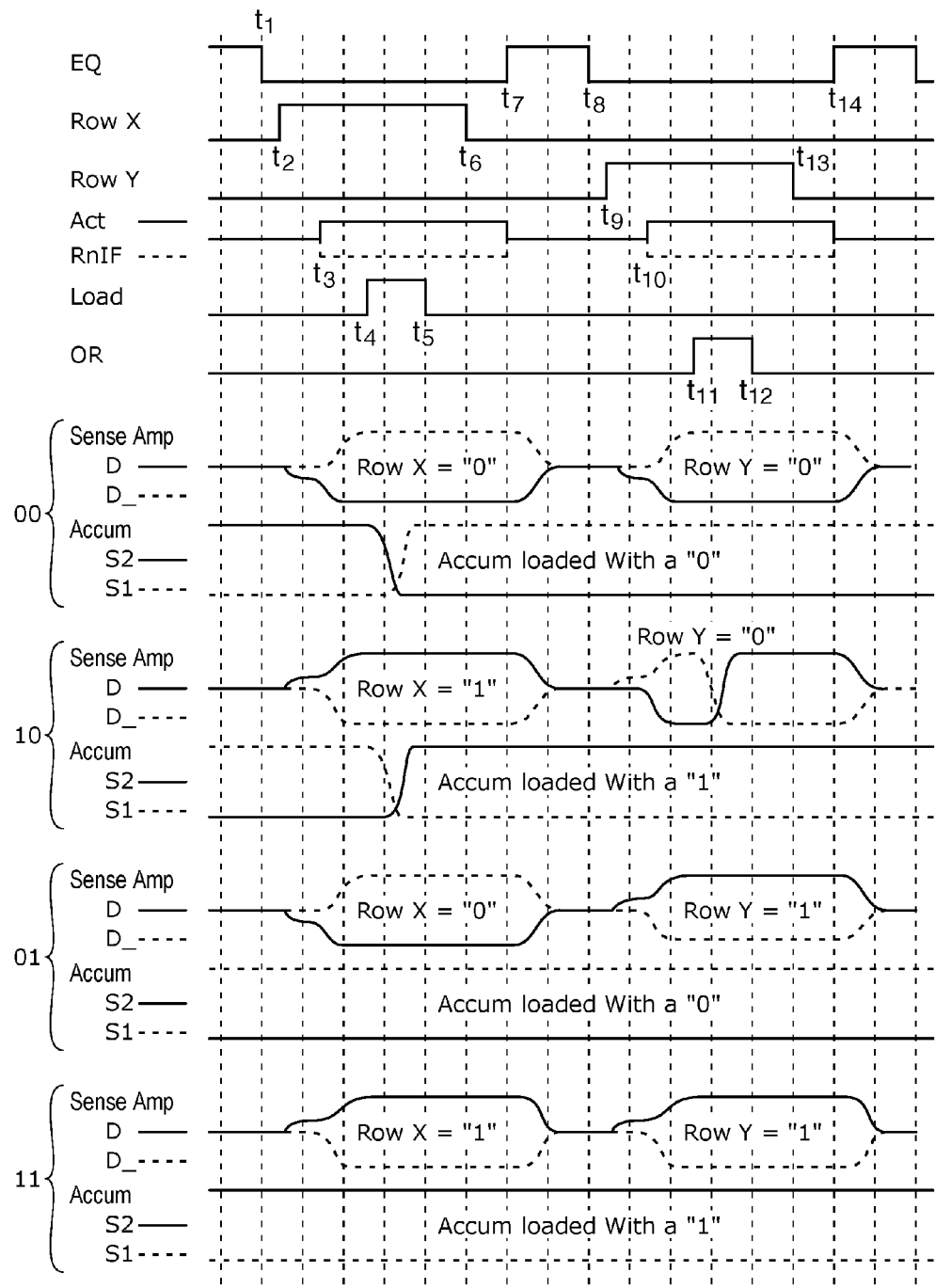

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206-2 and the secondary latch of the compute component 231-2) and the second data value (stored in a memory cell 201-3 coupled to Row Y 204-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

Deactivate EQ
Open Row Y
Fire Sense Amps (after which Row Y data resides in the sense amps)
Close Row Y
When Row Y is closed, the sense amplifier still contains the Row Y data value.
Activate OR
This results in the sense amplifier being written to the value of the function (e.g., Row X OR Row Y), which may overwrite the data value from Row Y previously stored in the sense amplifier as follows:

If the accumulator contains a "0" (i.e., a voltage corresponding to a "0" on node S2 and a voltage corresponding to a "1" on node S1), the sense amplifier data remains unchanged (Row Y data)

If the accumulator contains a "1" (i.e., a voltage corresponding to a "1" on node S2 and a voltage corresponding to a "0" on node S1), the sense amplifier data is written to a "1"

This operation leaves the data in the accumulator unchanged.

Deactivate OR
Precharge

The "Deactivate EQ" (shown at is in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231-2 and the second data value (e.g., Row Y) stored in the sense amplifier 206-2, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206-2 (e.g., from Row Y). The result of the OR operation should be a "1" if the data value stored in the sense amplifier 206-2 (e.g., from Row Y) is a "1," but the result of the OR operation should be a "0" if the data value stored in the sense amplifier 206-2 (e.g., from Row Y) is also a "0." The sensing circuitry 250-2 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206-2 is not coupled to ground (either side), and the data value previously stored in the sense amplifier 206-2 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206-2 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206-2 as a result of the OR operation when the secondary latch of the accumulator contains a "1" regardless of the data value previously stored in the sense amp. This operation leaves the data in the accumulator unchanged. FIG. 6B shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S2 of the secondary latch of the compute component 231-2 for an OR logical operation involving each of the possible combination of operands (e.g., Row X/Row Y data values 00, 10, 01, and 11).

After the result of the OR operation is initially stored in the sense amplifier 206-2, "Deactivate OR" in the pseudo code above indicates that the OR control signal goes low as shown at $t_{12}$ in FIG. 6B, causing pass transistor 207-2 to stop conducting to isolate the sense amplifier 206-2 (and data line D 205-2) from ground. If not previously done, Row Y can be closed (as shown at $t_{13}$ in FIG. 6B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250-2 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row)(}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-2 to conduct and activating the ANDinv control signal causes transistor 214-1 to conduct. In each case, asserting the appropriate inverted control signal can flip the sense amplifier and cause the result initially stored in the sense amplifier 206-2 to be that of the AND operation using the inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206-2. As previously mentioned, activating the ORinv control signal causes transistor 214-2 to conduct and activating the ANDinv control signal causes transistor 214-1 to conduct. The ORinv and/or ANDinv control signals are used in implementing the NOT function, as described in the pseudocode below:

Copy Row X into the Accumulator
Deactivate EQ
Open Row X
Fire Sense Amps (after which Row X data resides in the sense amps)
Activate LOAD (sense amplifier data (Row X) is transferred to nodes S1 and S2 of the Accumulator and resides there dynamically
Deactivate LOAD
Activate ANDinv and ORinv (which puts the compliment data value on the data lines)
This results in the data value in the sense amplifier being inverted (e.g., the sense amplifier latch is flipped)
   This operation leaves the data in the accumulator unchanged
Deactivate ANDinv and ORinv
Close Row X
Precharge The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above for the AND operation and OR operation. However, rather than closing the Row X and Precharging after the Row X data is loaded into the sense amplifier 206-2 and copied into the dynamic latch, a compliment version of the data value in the dynamic latch of the accumulator can be placed on the data line and thus transferred to the sense amplifier 206-2. This is done by enabling (e.g., causing transistor to conduct) and disabling the invert transistors (e.g., ANDinv and ORinv). This results in the sense amplifier 206-2 being flipped from the true data value that was previously stored in the sense amplifier to a compliment data value (e.g., inverted data value) being stored in the sense amp. As such, a true or compliment version of the data value in the accumulator can be transferred to the sense amplifier based upon activating or not activating ANDinv and/or ORinv. This operation leaves the data in the accumulator unchanged.

Because the sensing circuitry 250-2 shown in FIG. 2A initially stores the result of the AND, OR, and/or NOT logical operations in the sense amplifier 206-2 (e.g., on the sense amplifier nodes), these logical operation results can be communicated easily and quickly to any enabled row, any row activated after the logical operation is complete, and/or into the secondary latch of the compute component 231-2. The sense amplifier 206-2 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206-2 fires.

When performing logical operations in this manner, the sense amplifier 206-2 can be pre-seeded with a data value from the dynamic latch of the accumulator to reduce overall current utilized because the sense amps 206-2 are not at full rail voltages (e.g., supply voltage or ground/reference voltage) when accumulator function is copied to the sense amplifier 206-2. An operation sequence with a pre-seeded sense amplifier 206-2 either forces one of the data lines to the reference voltage (leaving the complementary data line at $V_{DD}/2$, or leaves the complementary data lines unchanged. The sense amplifier 206-2 pulls the respective data lines to full rails when the sense amplifier 206-2 fires. Using this sequence of operations will overwrite data in an enabled row.

A SHIFT operation can be accomplished by multiplexing ("muxing") two neighboring data line complementary pairs using a DRAM isolation (ISO) scheme. According to embodiments of the present disclosure, the shift circuitry 223 can be used for shifting data values stored in memory cells coupled by a particular pair of complementary data lines to the sensing circuitry 250-2 (e.g., sense amplifier 206-2) corresponding to a different pair of complementary data lines (e.g., such as a sense amplifier 206-2 corresponding to a left or right adjacent pair of complementary data lines. As used herein, a sense amplifier 206-2 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized by the following pseudocode follows:

Deactivate Norm and Activate Shift
Deactivate EQ
Open Row X
Fire Sense Amps (after which shifted Row X data resides in the sense amps)
Activate Norm and Deactivate Shift
Close Row X
Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206-3 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206-3.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206-3 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift
Deactivate EQ
Open Row X
Fire Sense Amps (after which Row X data resides in the sense amps)
Deactivate Norm and Activate Shift
Sense amplifier data (shifted left Row X) is transferred to Row X
Close Row X
Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206-2 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudocode for the AND operation and OR operation. After these operations, the Row X data value for the memory cell coupled to the pair of complementary data lines corresponding to the sense circuitry 250-2 is stored in the sense amplifier 206-2.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 7:
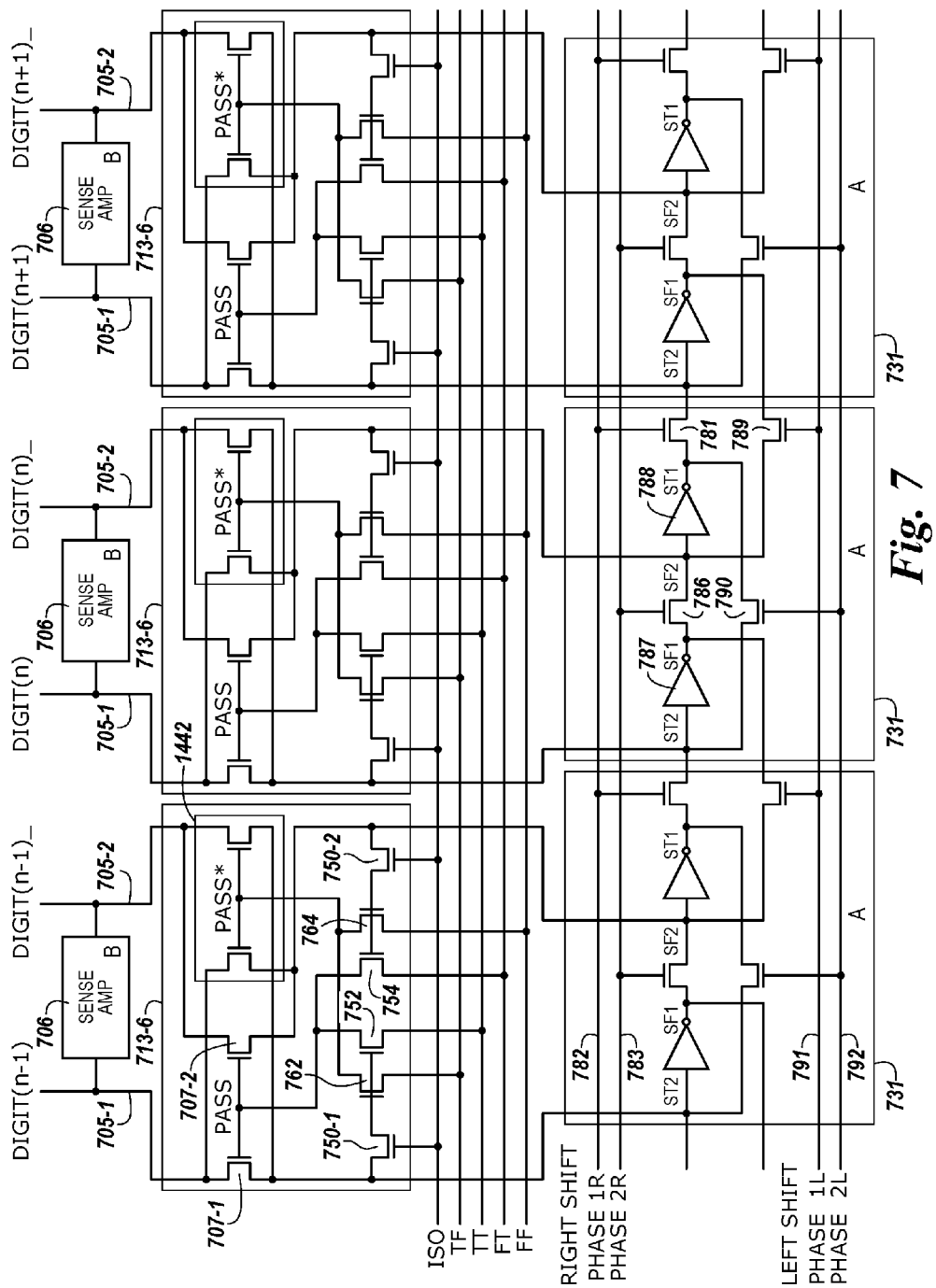
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a number of sense amplifiers 706 coupled to respective pairs of complementary sense lines 705-1 and 705-2, and a corresponding number of compute component 731 coupled to the sense amplifiers 706 via pass gates 707-1 and 707-2 (which can correspond to sense amplifiers 206, sense lines 205-1 and 205-2, compute components 231 coupled to sense amplifiers 206 via pass gates 207-1 and 207-2 in FIG. 2A). The gates of the pass gates 707-1 and 707-2 can be controlled by a logical operation selection logic signal, PASS. For example, an output of the logical operation selection logic 713-6 can be coupled to the gates of the pass gates 707-1 and 707-2.

According to the embodiment illustrated in FIG. 7, the compute components 731 can comprise respective stages (e.g., shift cells) of a loadable shift register configured to shift data values left and right. For example, as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L can be applied to respective control lines 782, 783, 791 and 792 to enable/disable feedback on the latches of the corresponding compute components 731 in association with performing logical operations and/or shifting data in accordance with embodiments described herein. Examples of shifting data (e.g., from a particular compute component 731 to an adjacent compute component 731) is described further below with respect to FIGS. 9 and 10.

Figure 9:
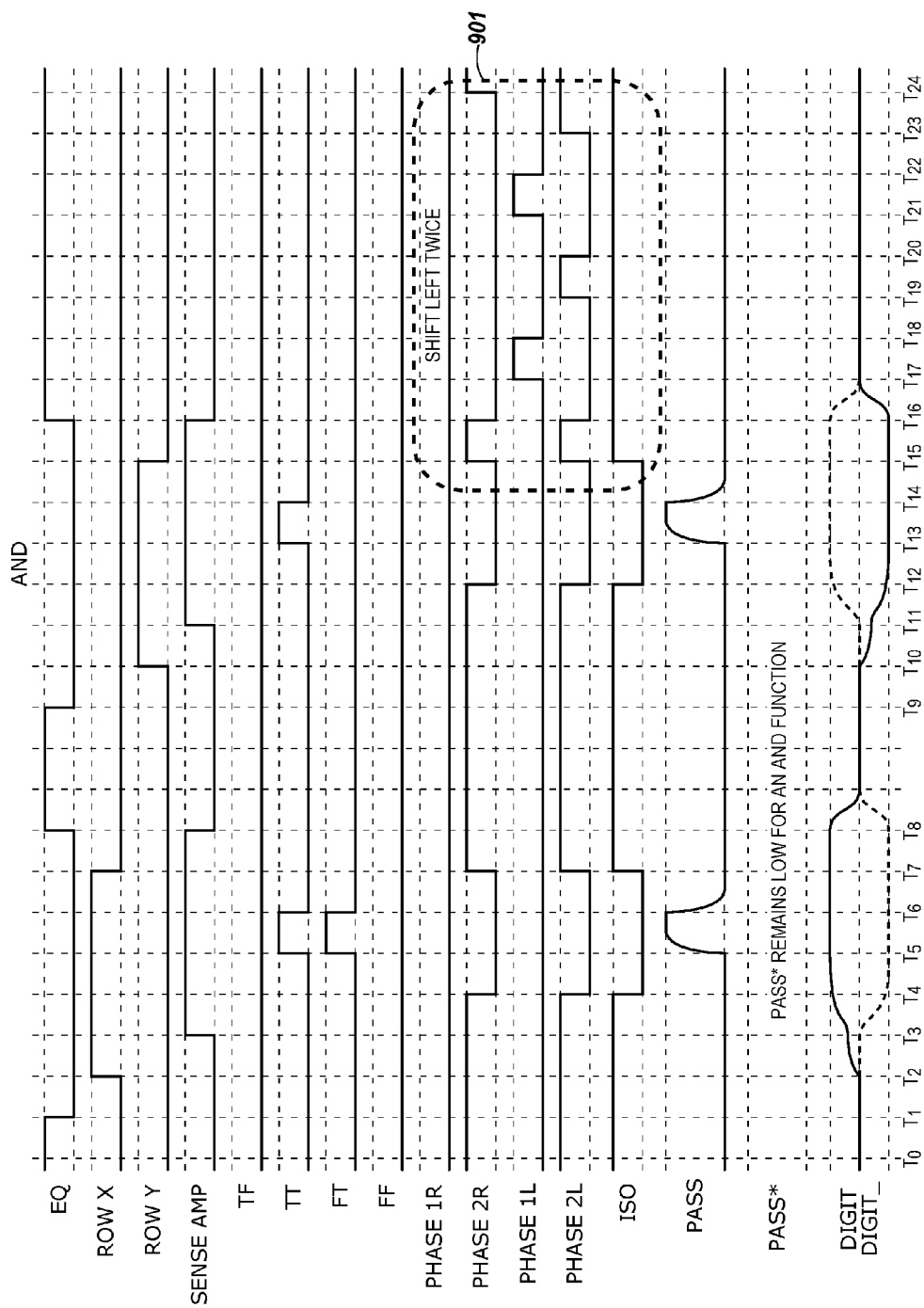
FIG. 9 illustrates a timing diagram associated with performing a logical operation and a shifting operation using the sensing circuitry in accordance with a number of embodiments of the present disclosure.
Figure 10:
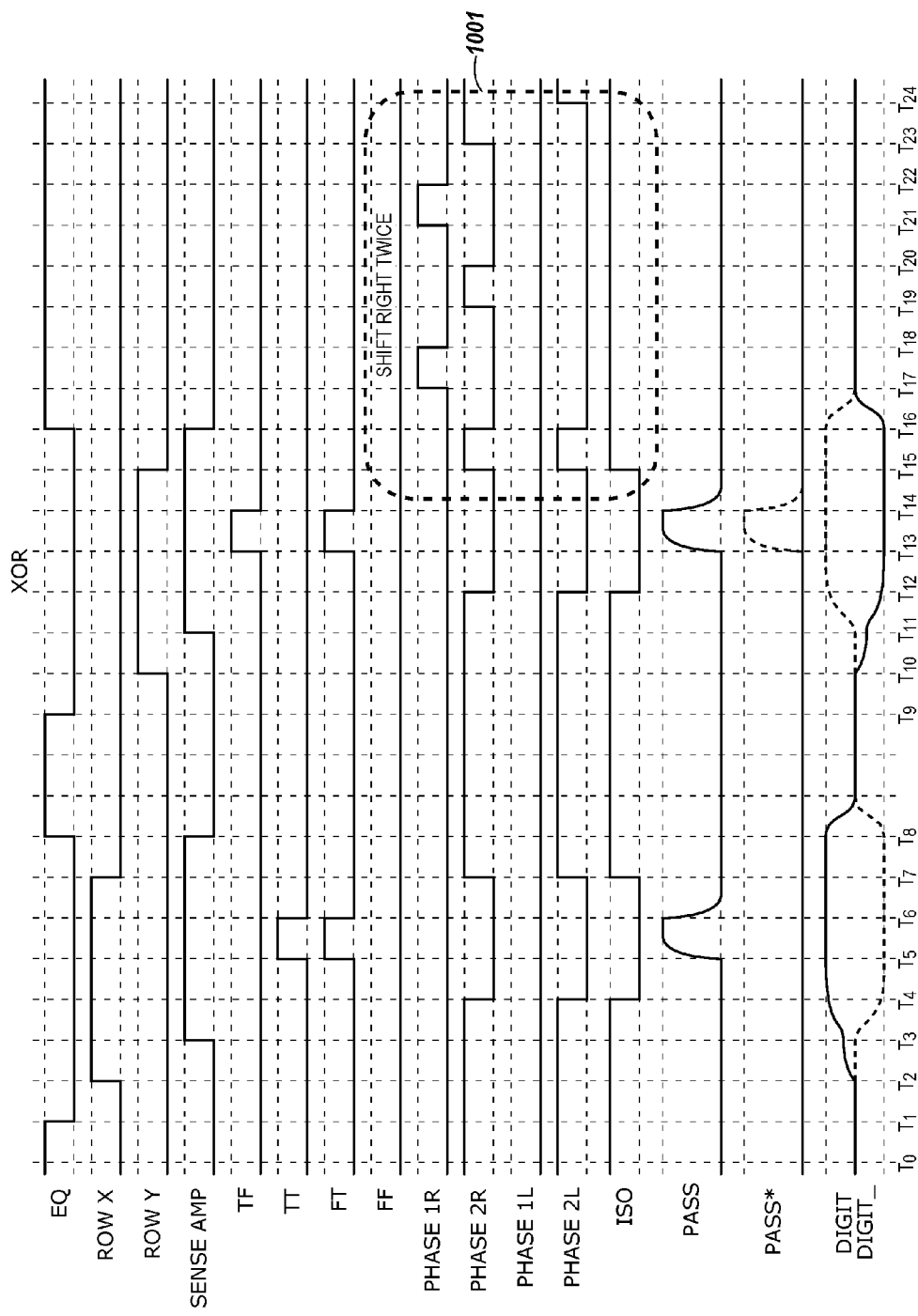
FIG. 10 illustrates a timing diagram associated with performing a logical operation and a shifting operation using the sensing circuitry in accordance with a number of embodiments of the present disclosure.

The logical operation selection logic 713-6 includes the swap gates 742, as well as logic to control the pass gates 707-1 and 707-2 and the swap gates 742. The logical operation selection logic 713-6 includes four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line through isolation transistor 750-1 (having a gate coupled to an ISO signal control line). Gates of logic selection transistors 764 and 754 are coupled to the complementary sense line through isolation transistor 750-2 (also having a gate coupled to an ISO signal control line). FIGS. 9 and 10 illustrate timing diagrams associated with performing logical operations and shifting operations using the sensing circuitry shown in FIG. 7.

Figure 8:
FIG. 8 is a logic table illustrating selectable logic operation results implemented by a sensing circuitry in accordance with a number of embodiments of the present disclosure.

FIG. 8 is a logic table illustrating selectable logic operation results implemented by a sensing circuitry (e.g., sensing circuitry 750 shown in FIG. 7) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 706 and compute component 731. The four control signals (e.g., TF, TT, FT, and FF), in conjunction with a particular data value present on the complementary sense lines (e.g., on nodes S and S*), controls the pass gates 707-1 and 707-2 and swap transistors 742, which in turn affects the data value in the compute component 731 and/or sense amplifier 706 before/after firing. The capability to selectably control the swap transistors 742 facilitates implementing logical operations involving inverse data values (e.g., inverse operands and/or inverse result), among others.

Similar to the logic tables illustrated in FIG. 10, Logic Table 8-1 illustrated in FIG. 8 shows the starting data value stored in the compute component 731 shown in column A at 844, and the starting data value stored in the sense amplifier 706 shown in column B at 845. The other 3 column headings in Logic Table 8-1 refer to the state of the pass gates 707-1 and 707-2 and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "NOT OPEN" column 856 corresponds to the pass gates 707-1 and 707-2 and the swap transistors 742 both being in a non-conducting condition, the "OPEN TRUE" column 870 corresponds to the pass gates 707-1 and 707-2 being in a conducting condition, and the "OPEN INVERT" column 871 corresponds to the swap transistors 742 being in a conducting condition. The configuration corresponding to the pass gates 707-1 and 707-2 and the swap transistors 742 both being in a conducting condition is not reflected in Logic Table 8-1 since this results in the sense lines being shorted together.

Via selective control of the pass gates 707-1 and 707-2 and the swap transistors 742, each of the three columns of the upper portion of Logic Table 8-1 can be combined with each of the three columns of the lower portion of Logic Table 8-1 to provide nine (e.g., 3×3) different result combinations, corresponding to nine different logical operations, as indicated by the various connecting paths shown at 875. The nine different selectable logical operations that can be implemented by the sensing circuitry 750 are summarized in Logic Table 8-2.

The columns of Logic Table 8-2 show a heading 880 that includes the states of logic selection control signals (e.g., FF, FT, TF, TT). For example, the state of a first logic selection control signal (e.g., FF) is provided in row 876, the state of a second logic selection control signal (e.g., FT) is provided in row 877, the state of a third logic selection control signal (e.g., TF) is provided in row 878, and the state of a fourth logic selection control signal (e.g., TT) is provided in row 879. The particular logical operation corresponding to the results is summarized in row 847.

FIG. 9 illustrates a timing diagram associated with performing a logical AND operation and a shifting operation using the sensing circuitry in accordance with a number of embodiments of the present disclosure. FIG. 9 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 706). The TF, TT, FT, and FF signals correspond to logic selection control signals such as those shown in FIG. 7 (e.g., signals coupled to logic selection transistors 762, 752, 754, and 764). The PHASE 1R, PHASE 2R, PHASE 1L, and PHASE 2L signals correspond to the control signals (e.g., clock signals) provided to respective control lines 782, 783, 791 and 792 shown in FIG. 7. The ISO signal corresponds to the signal coupled to the gates of the isolation transistors 750-1 and 750-2 shown in FIG. 7. The PASS signal corresponds to the signal coupled to the gates of pass transistors 707-1 and 707-2 shown in FIG. 7, and the PASS* signal corresponds to the signal coupled to the gates of the swap transistors 742. The DIGIT and DIGIT_signals correspond to the signals present on the respective sense lines 705-1 (e.g., DIGIT (n)) and 705-2 (e.g., DIGIT (n)_).

The timing diagram shown in FIG. 9 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 9, reference will be made to the sensing circuitry described in FIG. 7. For example, the logical operation described in FIG. 9 can include storing the data value of the ROW X memory cell (e.g., the "ROW X data value) in the latch of the corresponding compute component 731 (e.g., the "A" data value), which can be referred to as the accumulator 731, storing the data value of the ROW Y memory cell (e.g., the "ROW Y data value") in the latch of the corresponding sense amplifier 706 (e.g., the "B" data value), and performing a selected logical operation (e.g., a logical AND operation in this example) on the ROW X data value and the ROW Y data value, with the result of the selected logical operation being stored in the latch of the compute component 731.

As shown in FIG. 9, at time $T_1$, equilibration of the sense amplifier 706 is disabled (e.g., EQ goes low). At time $T_2$, ROW X goes high to access (e.g., select) the ROW X memory cell. At time $T_3$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW X data value (e.g., as shown by the DIGIT and DIGIT_signals), and the ROW X data value is latched in the sense amplifier 706. At time $T_4$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_4$, ISO goes low, which disables isolation transistors 750-1 and 750-2. At time $T_5$, TT and FT are enabled (e.g., go high), which results in PASS going high (e.g., since either transistor 752 or 754 will conduct depending on which of node ST2 or node SF2 was high when ISO was disabled at time $T_4$ (recall that when ISO is disabled, the voltages of the nodes ST2 and SF2 reside dynamically on the gates of the respective enable transistors 752 and 754). PASS going high enables the pass transistors 707-1 and 707-2 such that the DIGIT and DIGIT_signals, which correspond to the ROW X data value, are provided to the respective compute component nodes ST2 and SF2. At time $T_6$, TT and FT are disabled, which results in PASS going low, which disables the pass transistors 707-1 and 707-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 731 such that the ROW X data value is latched therein. Enabling ISO at time $T_7$ again couples nodes ST2 and SF2 to the gates of the enable transistors 752, 754, 762, and 764. At time $T_8$, equilibration is enabled (e.g., EQ goes high such that DIGIT and DIGIT are driven to an equilibrate voltage such as $V_{DD}/2$) and the sense amplifier 706 is disabled (e.g., SENSE AMP goes low).

With the ROW X data value latched in the compute component 731, equilibration is disabled (e.g., EQ goes low at time $T_9$). At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_{12}$, ISO goes low, which disables isolation transistors 750-1 and 750-2. Since the desired logical operation in this example is an AND operation, at time $T_{13}$, TT is enabled while TF, FT and FF remain disabled (as shown in TABLE 8-2, FF=0, FT=0, TF=0, and TT=1 corresponds to a logical AND operation). Whether enabling TT results in PASS going high depends on the value stored in the compute component 731 when ISO is disabled at time $T_{12}$. For example, enable transistor 752 will conduct if node ST2 was high when ISO is disabled, and enable transistor will not conduct if node ST2 was low when ISO was disabled at time $T_{12}$.

In this example, if PASS goes high at time $T_{13}$, the pass transistors 707-1 and 707-2 are enabled such that the DIGIT and DIGIT_signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT (e.g., the ROW Y data value). In this example, if PASS stays low at time $T_{13}$, the pass transistors 707-1 and 707-2 are not enabled such that the DIGIT and DIGIT_signals, which correspond to the ROW Y data value, remain isolated from the nodes ST2 and SF2 of the compute component 731. As such, the data value in the compute component (e.g., the ROW X data value) would remain the same.

At time $T_{14}$, TT is disabled, which results in PASS going (or remaining) low, such that the pass transistors 707-1 and 707-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the AND operation (e.g., "A" AND "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT are driven to an equilibrate voltage) and the sense amplifier 706 is disabled (e.g., SENSE AMP goes low).

The result of the AND operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 901) signaling associated with shifting data (e.g., from a compute component 731 to an adjacent compute component 731). The example shown in FIG. 9 illustrates two left shifts such that a data value stored in a compute component corresponding to column "N" is shifted left to a compute component corresponding to column "N-2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 789 to conduct, which causes the data value at node SF1 to move left to node SF2 of a left-adjacent compute component 731. PHASE 2L is subsequently enabled at time $T_{19}$ and disabled at time $T_{20}$. Enabling PHASE 2L causes transistor 790 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 10 illustrates a timing diagram associated with performing a logical XOR operation and a shifting operation using the sensing circuitry in accordance with a number of embodiments of the present disclosure. FIG. 10 includes the same waveforms described in FIG. 9 above. However, the timing diagram shown in FIG. 10 is associated with performing a logical XOR operation on a ROW X data value and a ROW Y data value (e.g., as opposed to a logical AND operation). Reference will again be made to the sensing circuitry described in FIG. 7.

The signaling indicated at times $T_0$ through $T_9$ for FIG. 10 are the same as for FIG. 9 and will not be repeated here. As such, at time T9, EQ is disabled with the ROW X data value being latched in the compute component 731. At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component 731 may be overwritten during the logical operation. Also, at time $T_{12}$, ISO goes low, which disables isolation transistors 750-1 and 750-2. Since the desired logical operation in this example is an XOR operation, at time $T_{13}$, TF and FT are enabled while TT and FF remain disabled (as shown in TABLE 8-2, FF=0, FT=1, TF=1, and TT=0 corresponds to a logical XOR (e.g., "AXB") operation). Whether enabling TF and FT results in PASS or PASS* going high depends on the value stored in the compute component 731 when ISO is disabled at time $T_{12}$. For example, enable transistor 762 will conduct if node ST2 was high when ISO is disabled, and enable transistor 762 will not conduct if node ST2 was low when ISO was disabled at time $T_{12}$. Similarly, enable transistor 754 will conduct if node SF2 was high when ISO is disabled, and enable transistor 754 will not conduct if node SF2 was low when ISO is disabled.

In this example, if PASS goes high at time $T_{13}$, the pass transistors 707-1 and 707-2 are enabled such that the DIGIT and DIGIT_signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time $T_{13}$, the pass transistors 707-1 and 707-2 are not enabled such that the DIGIT and DIGIT_signals, which correspond to the ROW Y data value, remain isolated from the nodes ST2 and SF2 of the compute component 731. As such, the data value in the compute component (e.g., the ROW X data value) would remain the same. In this example, if PASS* goes high at time $T_{13}$, the swap transistors 742 are enabled such that the DIGIT and DIGIT_signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n) would be provided to node ST2). As such, the value stored in the compute component 731 (e.g., the ROW X data value) may be flipped, depending on the value of DIGIT and DIGIT_ (e.g., the ROW Y data value). In this example, if PASS* stays low at time $T_{13}$, the swap transistors 742 are not enabled such that the DIGIT and DIGIT_signals, which correspond to the ROW Y data value, remain isolated from the nodes ST2 and SF2 of the compute component 731. As such, the data value in the compute component (e.g., the ROW X data value) would remain the same.

At time $T_{14}$, TF and FT are disabled, which results in PASS and PASS* going (or remaining) low, such that the pass transistors 707-1 and 707-2 and swap transistors 742 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the XOR operation (e.g., "A" XOR "B") is latched therein. Enabling ISO at time Tis again couples nodes ST2 and SF2 to the gates of the enable transistors 752, 754, 762, and 764. At time $T_{16}$, equilibration is enabled (e.g., EQ goes high such that DIGIT and DIGIT_ are driven to an equilibrate voltage) and the sense amplifier 706 is disabled (e.g., SENSE AMP goes low).

The result of the XOR operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 10 also includes (e.g., at 1001) signaling associated with shifting data (e.g., from a compute component 731 to an adjacent compute component 731). The example shown in FIG. 10 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 781 to conduct, which causes the data value at node ST1 to move right to node ST2 of a right-adjacent compute component 731. PHASE 2R is subsequently enabled at time $T_{19}$ and disabled at time $T_{20}$. Enabling PHASE 2R causes transistor 786 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 9 and 10 include the logical operation result being stored in the compute component (e.g., 731), sensing circuitry in accordance with embodiments described herein can be operated to perform logical operations with the result being initially stored in the sense amplifier (e.g., as illustrated in FIG. 8). Also, embodiments are not limited to the "AND" and "XOR" logical operation examples described in FIGS. 9 and 10, respectively. For example, sensing circuitry in accordance with embodiments of the present disclosure (e.g., 750 shown in FIG. 7) can be controlled to perform various other logical operations such as those shown in Table 8-2.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDS or ORs in parallel, e.g., concurrently, using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving an off pitch processing unit discrete from the memory such that data must be transferred there between. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

What is claimed is:

1. A method for performing division operations comprising:
performing a division operation on:
a first vector comprising at least two elements that are different in length representing a number of dividends and initially stored in a group of memory cells coupled to a first access line and a number of sense lines of a memory array; and
a second vector comprising at least two elements that are different in length representing a number of divisors and initially stored in a group of memory cells coupled to a second access line and the number of sense lines of the memory array;
wherein the division operation includes dividing the elements of the first vector by respective elements of the second vector by performing a number of operations using sensing circuitry and at least one of the number of operations are performed without activating a column decode line of the memory array.

2. The method of claim 1, wherein performing at least one of the number of operations without activating a column decode line of the memory array comprises performing a number of AND operations, OR operations, and INVERT operations without transferring data external to the sensing circuitry via an input/output (I/O) line.

3. The method of claim 1, wherein a result of the division operation comprises a quotient vector representing respective results of dividing the elements of the first vector by respective elements of the second vector and is stored in a group of memory cells coupled to a third access line.

4. The method of claim 3, wherein the result of the division operation is stored in at least one of the group of memory cells coupled to the first access line and the group of memory cells coupled to the second access line.

5. The method of claim 1, wherein the number of sense lines each comprise a complementary sense line pair corresponding to a column of the memory array, and wherein the number of operations are performed using sensing circuitry coupled to respective complementary sense line pairs.

6. The method of claim 5, wherein each of the sensing circuitry comprises a sense amplifier and a compute component.

7. The method of claim 6, wherein the sense amplifier comprises a primary latch and the compute component comprises a secondary latch.

8. The method of claim 1, further comprising storing a first element and a second element of the first vector in a first group of memory cells coupled to the first access line, wherein each memory cell in the first group of memory cells stores a respective bit of the first vector.

9. The method of claim 8, further comprising storing a third element and a fourth element of the second vector in a second group of memory cells coupled to the second access line, wherein each memory cell in the second group of memory cells stores a respective bit of the second vector.

10. The method of claim 9, wherein the first element and the third element have a first length and the second element and the fourth element have a second length.

11. An apparatus comprising:
a first group of memory cells in a memory array coupled to a first access line and configured to store a first dividend element;
a second group of memory cells coupled to the first access line and configured to store a second dividend element;
a third group of memory cells coupled to a second access line and configured to store a first divisor element;
a fourth group of memory cells coupled to the second access line and configured to store a second divisor element; and
a controller configured to operate sensing circuitry to divide the first dividend element by the first divisor element and to divide the second dividend element by the second divisor element by performing a number of operations, wherein at least one of the number of operations is performed without activating a column decode line of the memory array.

12. The apparatus of claim 11, wherein the first group of memory cells and the third group of memory cells each comprise a same X number of memory cells and the second group of memory cells and the fourth group of memory cells each comprise a same Y number of memory cells.

13. The apparatus of claim 11, wherein the controller is configured to operate the sensing circuitry to divide the first dividend element by the first divisor element in parallel with dividing the second dividend element by the second divisor element.

14. The apparatus of claim 11, wherein the controller is configured to operate the sensing circuitry to perform a second variable compare operation with the second dividend element and the second divisor element by performing a number of AND operations, OR operations, and INVERT operations without transferring data via an input/output (I/O) line; and
wherein the first compare operation and the second compare operation are performed in parallel.

15. The apparatus of claim 14, wherein:
a result of the first variable compare operation is an indication of whether the first dividend element is less than, equal to, or greater than the first divisor element; and
a result of the second variable compare operation is an indication of whether the second dividend element is less than, equal to, or greater than the first divisor element.

16. The apparatus of claim 11, wherein the controller is configured to operate the sensing circuitry to perform the first variable compare operation comprises the sensing circuitry configured to:
create a first destination bit-vector that identifies a difference of the first dividend element as compared to the first divisor element;
create a second destination bit-vector that identifies a difference in the first divisor element as compared to the first dividend element.

17. The apparatus of claim 16, wherein the first destination bit-vector and the second destination bit-vector are the results of the first variable compare operation.

18. The apparatus of claim 16, wherein the controller is configured to operate the sensing circuitry to:
replicate bits in the first destination bit-vector that identify the difference in the first dividend element as compared to the first divisor element in a first replication phase; and
replicate bits in the second destination bit-vector that identify the difference in the first divisor element as compared to the first dividend element in the first replication phase.

19. The apparatus of claim 18, wherein the controller is configured to operate the sensing circuitry to:

store in the first destination bit-vector the difference in the first dividend element as compared to the first divisor element; and store in the second destination bit-vector a difference in the first divisor element as compared to the first dividend element.

20. The apparatus of claim 19, wherein the controller is configured to operate the sensing circuitry to:

replicate bits in the first destination bit-vector in a second replication phase; and replicate bits in the second destination bit-vector in the second replication phase;

wherein replicating the bits in the first replication phase and the second replication phase includes performing a number of right SHIFT operations.

21. The apparatus of claim 20, wherein the controller is configured to operate the sensing circuitry to store a static mask that defines a vector length for each of the variable length bit-vectors.

22. The apparatus of claim 21, wherein a quantity of the number of SHIFT operations performed is based on a longest vector length from among the vector lengths of each of the variable length bit-vectors.

23. The apparatus of claim 11, wherein:

the first dividend element and the first divisor element are a first bit-length;

the second dividend element and the second divisor element are a second bit-length; and the first bit-length and the second bit-length are different bit-lengths.

24. A method for performing a number of division operations on variable length elements, comprising:

using a controller configured to operate sensing circuitry for performing a division operation on:

a first vector comprising at least two elements that are different in length representing a number of dividends and initially stored in a group of memory cells coupled to a first access line and a number of sense lines of a memory array;

a second vector comprising at least two elements that are different in length representing a number of divisors and initially stored in a group of memory cells coupled to a second access line and the number of sense lines of the memory array;

wherein the division operation includes dividing the first vector by the second vector by performing a number of operations using sensing circuitry formed on pitch with the memory cells of the memory array; and storing a result of the division operation as a third vector stored in a group of memory cells coupled to a third access line.

25. The method of claim 24, wherein performing the division operation comprises performing a number of iterations of operations using:

a subtraction mask bit-vector;

a zero dividend bit-vector;

a quotient bit-vector; and a remainder bit-vector;

wherein each iteration of operations comprises determining whether a remainder value represented by the remainder element remains to be divided.

26. The method of claim 25 determining a portion of a number of dividends divisible by a number of divisors and a remainder for the portion.

27. The method of claim 26, wherein the first iteration of the number of iterations of operations is performed by the controller configured to operate the sensing circuitry to:

compare elements of the first vector with the variable length elements of the second vector that results in the subtraction mask bit-vector;

subtract elements of the second vector from the variable length elements of the first vector using the subtraction mask bit-vector; and store the result of the subtraction as the remainder bit-vector.

28. The method of claim 27, wherein the first iteration is performed by the controller configured to further operate the sensing circuitry to:

increment the quotient bit-vector by a count of one corresponding to the subtraction mask bit-vector;

perform an XOR operation on the remainder bit-vector and the first bit-vector; and store a result of the XOR operation in a number of corresponding compute components of the sensing circuitry.

29. The method of claim 28, wherein a BlockOR operation is performed on the result of the XOR operation stored in the number of corresponding compute components by determining if the result includes a particular value.

30. The method of claim 29, wherein when the result includes the particular value, an additional iteration is performed.

31. The method of claim 30, wherein the controller is configured to operate the sensing circuitry to perform additional iterations by:

storing the remainder bit-vector as the zero dividend bit-vector;

comparing the remainder bit-vector with the second vector representing the number of divisors to determine whether the remainder bit-vector is greater than the second vector;

storing a result of the compare operation as the subtraction mask bit-vector;

subtracting the variable length elements of the second vector from the remainder bit-vector and store as the new remainder bit-vector using the subtraction mask bit-vector; and incrementing the quotient bit-vector by a count of one corresponding to the subtraction mask bit-vector;

performing an XOR operation on the remainder bit-vector and the zero dividend bit-vector; and store a result of the XOR operation in the number of corresponding compute components of the sensing circuitry.

32. The method of claim 31, wherein the method further includes repeating the additional iterations until the result stored in the number of corresponding compute components no longer stores the particular value.

33. A method for dividing variable length elements comprising:

performing a variable length division operation in a memory array on:

a plurality (M) of first elements stored in a first group of memory cells coupled to a first access line and to a number of sense lines of a memory array, wherein at least two of the plurality of first elements have different bit-lengths; and a plurality (M) of second elements stored in the second group of memory cells coupled to a second access line and to the number of sense lines of the memory array, wherein at least two of the plurality of second elements have different bit-lengths; and providing a division operation result that indicates a quotient of each corresponding element of the plurality of M first elements with each corresponding element of the plurality of M second elements.

34. The method of claim 33, wherein:

a first number of the M first elements and the M second elements are comprised of N bits and a second number of the M first elements and the M second elements are comprised of P bits; and the first number of M first elements are divided by the corresponding first number of the M second elements and the second number of the M first elements are divided by the corresponding second number of the M second elements.

35. An apparatus, comprising:

a first plurality of memory cells configured to store a dividend bit-vector comprising a number of dividend elements;

a second plurality of memory cells configured to store a divisor bit-vector comprising a number of divisor elements; and sensing circuitry comprising:

a plurality of sense amplifiers each coupled to a corresponding one of the first plurality of memory cells; and a plurality of compute components each coupled to a corresponding one of the sense amplifiers; and wherein the sensing circuitry is controlled to implement logic operations in association with performing, in parallel, division on respective pairs of the number of dividend elements and the number of divisor elements, and the sensing circuitry configured to temporarily store elements of at least the dividend bit-vector and the divisor bit-vector in latches of at least one of the plurality of sense amplifiers and the plurality of compute components.

36. The apparatus of claim 35, further comprising:

a controller producing a control signal to perform the division operations, the division operations resulting in production of a quotient bit-vector and a remainder bit-vector corresponding to the respective pairs of the number of dividend elements and the number of divisor elements.

37. The apparatus of claim 35, wherein each of the dividend elements comprises a same bit length.

38. The apparatus of claim 35, wherein at least two of the dividend elements comprise different bit lengths.

* * * * *